(12) United States Patent
Yasuda et al.

(10) Patent No.: US 7,910,949 B2
(45) Date of Patent: Mar. 22, 2011

(54) POWER SEMICONDUCTOR DEVICE

(75) Inventors: Yukio Yasuda, Tokyo (JP); Atsunobu Kawamoto, Tokyo (JP); Shinsuke Goudo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 93 days.

(21) Appl. No.: 11/870,133

(22) Filed: Oct. 10, 2007

(65) Prior Publication Data

US 2008/0100147 A1 May 1, 2008

(30) Foreign Application Priority Data

Oct. 30, 2006 (JP) ................................ 2006-294074
May 16, 2007 (JP) ................................ 2007-130957

(51) Int. Cl.
*H01L 29/74* (2006.01)

(52) U.S. Cl. ........ 257/107; 257/197; 257/323; 257/282; 257/378; 257/315; 257/401; 257/307; 257/112; 257/477; 257/116; 257/E23.052; 257/E27.079; 257/E29.036; 257/E21.388; 257/E21.391; 327/434; 327/483

(58) Field of Classification Search .................. 323/282, 323/315; 327/434, 483; 257/197, 378, 401, 257/477, 107; 307/112, 116
See application file for complete search history.

(56) References Cited

U.S. PATENT DOCUMENTS

| | | | |
|---|---|---|---|
| 6,218,709 B1 * | 4/2001 | Yasuda | 257/378 |
| 6,242,890 B1 * | 6/2001 | Sudo et al. | 320/128 |
| 6,291,880 B1 * | 9/2001 | Ogawa et al. | 257/723 |
| 6,414,855 B1 * | 7/2002 | Yasuda | 363/19 |
| 6,787,881 B2 | 9/2004 | Letor et al. | |
| 2003/0042575 A1 * | 3/2003 | Takahashi et al. | 257/577 |
| 2003/0180997 A1 * | 9/2003 | Nakayama et al. | 438/200 |
| 2005/0104153 A1 * | 5/2005 | Yasuda | 257/477 |
| 2007/0200138 A1 * | 8/2007 | Ozeki et al. | 257/139 |
| 2008/0048630 A1 * | 2/2008 | Imanaka | 323/282 |
| 2008/0099838 A1 * | 5/2008 | Nishimura | 257/343 |

FOREIGN PATENT DOCUMENTS

| | | |
|---|---|---|
| JP | 11-233712 | 8/1999 |
| JP | 2000-183341 | 6/2000 |
| JP | 2004-96318 | 3/2004 |
| JP | 2005-150321 | 6/2005 |

* cited by examiner

*Primary Examiner* — Benjamin P Sandvik
*Assistant Examiner* — Farid Khan
(74) *Attorney, Agent, or Firm* — Oblon, Spivak, McClelland, Maier & Neustadt, L.L.P.

(57) ABSTRACT

A power semiconductor device includes a conductive board and a switching element mounted on the conductive board and electrically connected thereto. The power semiconductor device also includes an integrated circuit mounted on the conductive board at a distance from the switching element and electrically connected thereto. The switching element turns ON/OFF a connection between first and second main electrodes in response to a control signal inputted to a control electrode. The integrated circuit includes a control circuit which controls ON/OFF the switching element and a back side voltage detection element which detects a voltage of the back side of the integrated circuit.

17 Claims, 20 Drawing Sheets

201    202

POWER SEMICONDUCTOR DEVICE

BACKGROUND OF THE INVENTION

1. Field of the Invention

The present invention relates to a power semiconductor device, and more particularly, to a power semiconductor device capable of improving performance and the degree of integration of an integrated circuit and realizing integration between a switching element and the integrated circuit without deteriorating a heat radiation characteristic.

2. Background Art

To control the operation of a motor, it is necessary to change the amount and the direction of electric current which flows through a coil provided inside the motor. A switching element is used to control electric current which flows through such an inductive load. The switching element turns ON/OFF between first and second main electrodes in response to a control signal inputted to a control electrode. A control circuit controls ON/OFF of the switching element by giving a voltage or an electric current signal to the control electrode of the switching element. A bridge circuit or the like is constructed by combining a plurality of such switching elements.

When an electric current equal to or above a predetermined value flows through the switching element or when a voltage equal to or above a predetermined value is applied between the first and second main electrodes, power loss or dielectric breakdown of a semiconductor junction or the like thereby caused may lead to fatal destruction. This may prevent normal driving of the motor or the like. To avoid this, the control circuit is provided with a protection function for preventing destruction of the switching element (e.g., see Japanese Patent Laid-Open No. 2004-96318).

Realizing the protection function of the switching element requires a circuit which detects the condition of the switching element and a circuit which processes a detected signal. The control circuit is generally arranged in a concentrated manner at a certain distance from locations where a plurality of switching elements are mounted. On the other hand, the circuit which protects the switching element is preferably installed in the vicinity of the switching element.

As shown in FIG. 28, a switching element provided with a protection function is in actual use in recent years in which a switching element section 201 and a circuit element 202 for protecting the switching element are configured within the same substrate. Manufacturing this power semiconductor device requires a process of forming the circuit element 202 in addition to a process of forming the switching element section 201. However, the process of forming the switching element section is unnecessary for the circuit element 202, while the process of forming the circuit element is unnecessary for the switching element section 201. Therefore, commonality between both processes is generally sought after and as the degree of commonality increases, the number of useless processes decreases. However, there may be cases where manufacturing conditions such as most desirable concentration of impurities or depth of diffusion cannot help being changed in achieving commonality. Therefore, the higher the rate of commonality, the greater is the sacrifice in the aspect of performance.

However, in the case of an apparatus in which only a small amount of current is driven by the switching element, the whole product needs to be downsized, and this is likely to cancel out an increase of the manufacturing cost caused by the above described useless processes. On the other hand, in the case of an apparatus in which a large amount of current is driven by the switching element, the problem of power loss when the witching element is ON is considerable, and therefore there is a strong tendency to give priority to the performance of the switching element.

Furthermore, to reduce power loss of the switching element, it is effective to increase the size of the switching element and thereby reduce electric resistance. However, when forming a small circuit element in a large switching element, the waste in the process of forming the circuit element increases for the switching element, the manufacturing cost of the whole apparatus increases and the merit in incorporating the circuit element in the switching element fades away.

Therefore, as shown in FIG. 29, a power semiconductor device is in practical use in which an integrated circuit element 204 for protecting a switching element 203 is bonded onto the surface of the switching element 203 on a chip-on-chip basis and both are wire-bonded together. In this way, configuring the switching element 203 and the integrated circuit element 204 as separate chips prevents the process of forming the integrated circuit element 204 from being affected by the process of forming the switching element 203 and the processes can be optimized with an emphasis placed on improvements of the performance and the degree of integration of the integrated circuit.

SUMMARY OF THE INVENTION

The power semiconductor device in FIG. 29 needs to reserve a space for mounting the integrated circuit element 204 on the switching element 203. In the case of a small-capacity switching element having a small amount of current to be driven, the number of elements on the chip is small and the proportion of leading wires for outside electrodes is small. Therefore, it is relatively easy to reserve the space in which the integrated circuit element 204 is mounted on the switching element 203.

On the other hand, in the case of a large-capacity switching element, the electric resistance between the first and second main electrodes of the switching element needs to be reduced to the lowest possible level and power loss needs to be reduced. Therefore, generally, many wires are connected to the second main electrode of the switching element. Therefore, there is no free space like the small-capacity switching element on the surface of the large-capacity switching element. Therefore, the switching element and the integrated circuit cannot be integrated together.

Furthermore, in the case of a large-capacity switching element, the heat radiation characteristic not only on the back side but also on the front side is important. Therefore, it is important to reduce the thickness of the switching element 203. However, when the integrated circuit element 204 is mounted on the switching element 203, the element becomes thick and the heat radiation characteristic deteriorates.

The present invention has been implemented to solve the above described problems and it is an object of the present invention to provide a power semiconductor device capable of improving the performance and the degree of integration of an integrated circuit and realizing the integration between a switching element and the integrated circuit without deteriorating a heat radiation characteristic thereof.

According to one aspect of the present invention, a power semiconductor device comprises a conductive board; a switching element mounted on the conductive board and electrically connected thereto; and an integrated circuit mounted on the conductive board at a distance from the switching element and electrically connected thereto. The switching element turns ON/OFF a connection between first and second main electrodes in response to a control signal inputted to a control electrode. The integrated circuit comprises a control circuit which controls ON/OFF the switching element and a back side voltage detection element which detects a voltage of the back side of the integrated circuit.

According to the present invention, it is possible to improve the performance and the degree of integration of the integrated circuit and realize the integration between the switching element and the integrated circuit without deteriorating a heat radiation characteristic thereof.

Other and further objects, features and advantages of the invention will appear more fully from the following description.

DETAILED DESCRIPTION OF THE PREFERRED EMBODIMENTS

Embodiment 1

Figure 1:
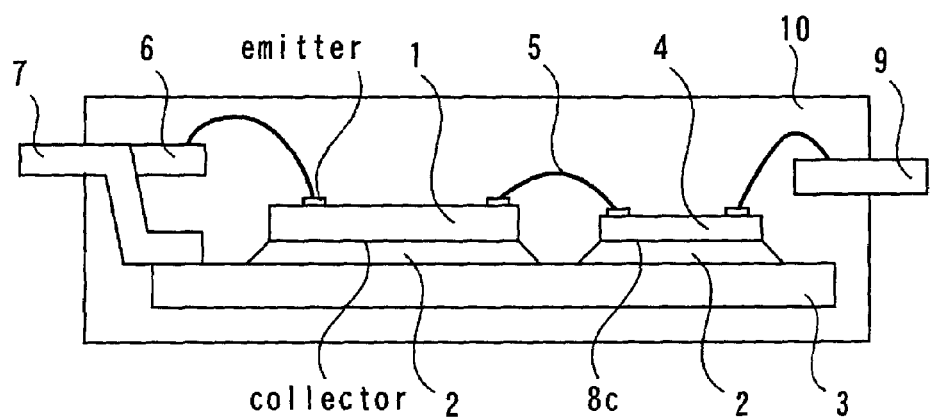
FIG. 1 is a side view showing a power semiconductor device according to Embodiment 1 of the present invention.
Figure 2:
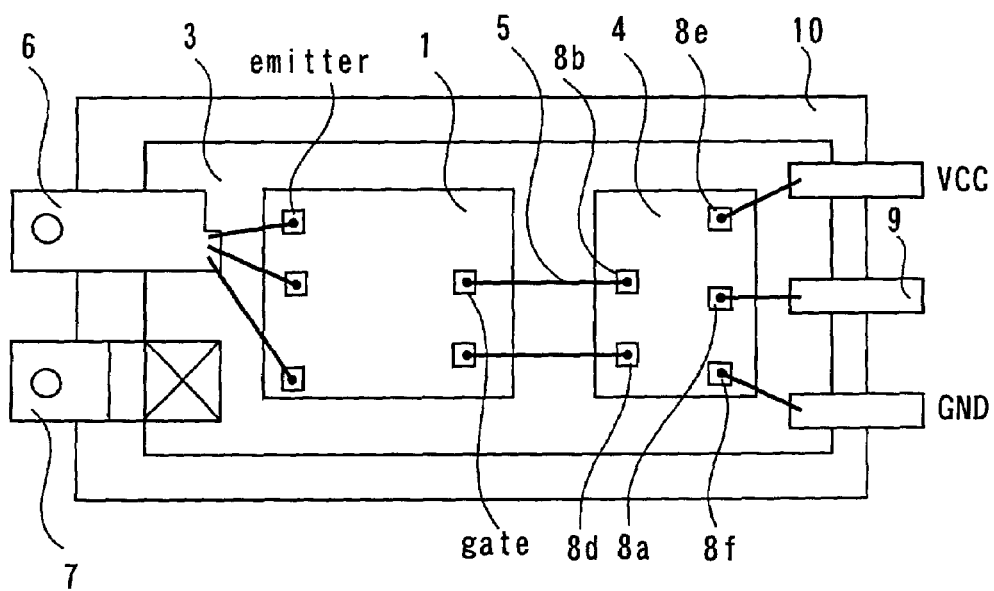
FIG. 2 is a plan view showing a power semiconductor device according to Embodiment 1 of the present invention.
Figure 3:
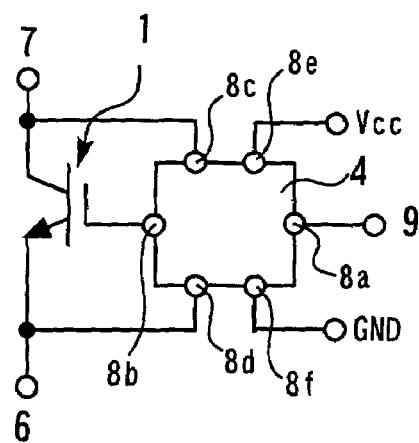
FIG. 3 is a circuit diagram showing a power semiconductor device according to Embodiment 1 of the present invention.

FIG. 1 is a side view showing a power semiconductor device according to Embodiment 1 of the present invention, FIG. 2 is a plan view thereof and FIG. 3 is a circuit diagram thereof.

A switching element 1 turns ON/OFF the connection between first and second main electrodes in response to a control signal inputted to a control electrode. As the switching element 1, a bipolar transistor, insulated gate bipolar transistor (IGBT) or power MOSFET (Metal Oxided Semiconductor Field Effect Transistor) or the like is used. The first main electrode corresponds to a collector or a drain, the second main electrode corresponds to an emitter or a source and the control electrode corresponds to a base or a gate. Here, a case where an IGBT is used as the switching element 1 will be explained.

The switching element 1 is mounted on a conductive board 3 through a conductive junction member 2 such as solder. The collector of the switching element 1 is on the underside of the chip and is electrically connected to the conductive board 3.

A back side high voltage integrated circuit 4 (integrated circuit) is mounted on the conductive board 3 through the conductive junction member 2. However, though the back side high voltage integrated circuit 4 is disposed in the vicinity of the switching element 1 on the conductive board 3, it is separated from the switching element 1. A back side electrode (which will be described later) of the back side high voltage integrated circuit 4 is electrically connected to the conductive board 3. A control element such as a control circuit which controls ON/OFF of the switching element 1 is formed on the surface of the back side high voltage integrated circuit 4.

The emitter of the switching element 1 is on the top surface of the chip and is connected to a lead terminal 6 through a wire 5. The collector of the switching element 1 and the back side electrode of the back side high voltage integrated circuit 4 are connected to a lead terminal 7 through the conductive board 3. A control input terminal 8a of the back side high voltage integrated circuit 4 is connected to a lead terminal 9. The gate of the switching element 1 is on the top surface of the chip, a control output terminal 8b of the back side high voltage integrated circuit 4 is on the top surface of the chip and both are connected together by the wire 5. Terminals 8c to 8f of the back side high voltage integrated circuit 4 are connected to the collector, emitter, power supply Vcc and grounding point GND of the switching element 1 respectively. Furthermore, the switching element 1, conductive board 3, back side high voltage integrated circuit 4 and wire 5 or the like are sealed with mold resin 10.

The withstand voltage between the front side and back side of the back side high voltage integrated circuit 4 is configured to be higher than the withstand voltage between the front side and back side of the switching element 1. In this way, even when a higher voltage than the emitter-collector withstand voltage of the switching element 1 is applied between the front side and back side of the back side high voltage integrated circuit 4, the circuit element provided on the surface of the back side high voltage integrated circuit 4 can operate normally. Therefore, the circuit element of the back side high voltage integrated circuit 4 can operate normally while exchanging signals with the conductive board 3 from the back side of the chip.

Even when the withstand voltage between the front side and back side of the back side high voltage integrated circuit 4 is smaller than the withstand voltage between the front side and back side of the switching element 1, there will be no problem if the power semiconductor device is used with the operation range thereof restricted to be equal to or below the withstand voltage of the back side high voltage integrated circuit 4 or if a protection mechanism or the like against a high voltage is provided though details thereof are omitted.

Figure 4:
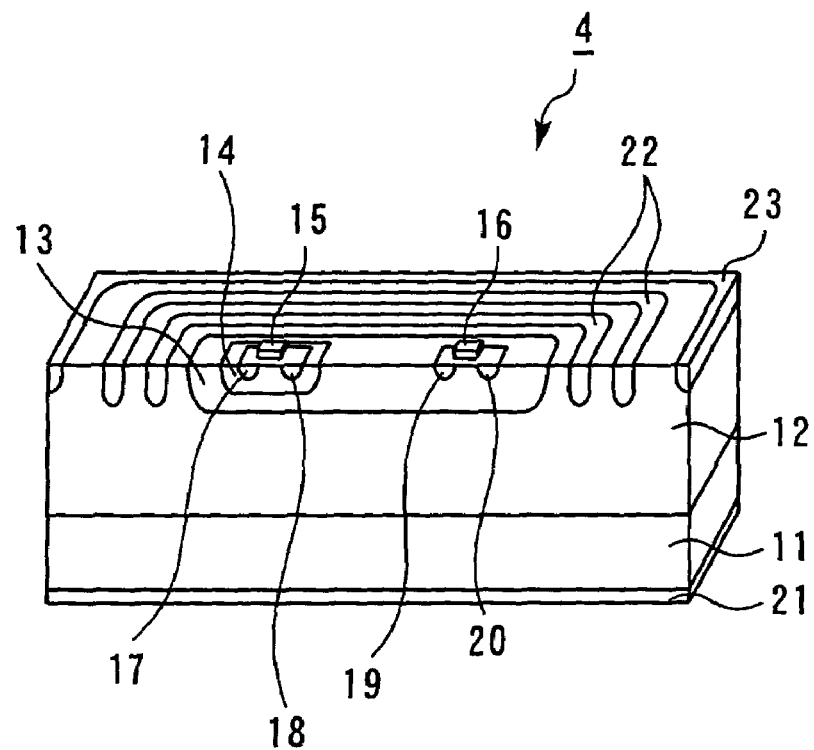
FIG. 4 is a cross-sectional perspective view showing the back side high voltage integrated circuit according to Embodiment 1 of the present invention.

FIG. 4 is a cross-sectional perspective view showing the back side high voltage integrated circuit according to Embodiment 1 of the present invention. An n-type semiconductor layer 12 is provided on a p-type semiconductor layer 11. A p-type diffusion layer 13 is provided on the surface of this n-type semiconductor layer 12. An n-type diffusion layer 14 is provided in a part of the p-type diffusion layer 13. A gate 15 of a p-type transistor is provided on the surface of the n-type diffusion layer 14 through a gate insulation film. A gate 16 of an n-type transistor is provided on the surface of the p-type diffusion layer 13 through a gate insulation film. P-type diffusion layers 17, 18 are provided on both sides of the gate 15 of the p-type transistor and n-type diffusion layers 19, 20 are provided on both sides of the gate 16 of the n-type transistor.

A back side electrode 21 is provided on the underside of the p-type semiconductor layer 11. This back side electrode 21 contacts the conductive board 3. Furthermore, the back side electrode 21 corresponds to the terminal 8c in FIG. 3. A voltage of approximately 600 V is applied to the back side electrode 21, but the circuit element on the surface of the back side high voltage integrated circuit 4 operates on approximately 8 V.

Here, a normal integrated circuit is configured such that the back side potential of the substrate is set to 0 V and the front side potential falls within a range of approximately several tens of V relative to the potential of the emitter in order to prevent misoperation of parasitic diodes formed at various locations. When such a normal integrated circuit is mounted on the conductive board 3, a current flows from the back side to the front side of the integrated circuit via the parasitic diodes. When the IGBT is turned OFF, an excessive current flows from the back side to the front side of the integrated circuit and not only the current that flows through the load cannot be controlled normally but also the integrated circuit is destroyed.

On the other hand, the back side high voltage integrated circuit 4 according to this embodiment is used with the back side potential of the substrate set higher than the front side potential. In this back side high voltage integrated circuit 4, even when the back side potential and the front side potential are reversed, since the p-type semiconductor layer 11 is provided on the back side and the n-type semiconductor layer 12 is provided on the front side, no current flows from the front side to the back side. Therefore, it is possible to prevent misoperation of the parasitic diodes provided at various locations of the back side high voltage integrated circuit 4.

Furthermore, in the back side high voltage integrated circuit 4, the potential of the back side of the substrate is substantially equivalent to the potential at the end face of the chip. A high voltage is applied between the back side and the end face of the chip and the circuit element provided on the front side. Therefore, to protect the circuit element as in the case of the switching element 1, guard rings 22 made up of a p-type diffusion layer are provided on the surface of the n-type semiconductor layer 12 so as to surround the p-type diffusion layer 13. Furthermore, an n-type diffusion layer 23 is provided so as to surround the outside thereof.

In this embodiment, the back side high voltage integrated circuit 4 and the switching element 1 are formed on separate chips and mounted on the conductive board 3 respectively. Therefore, the process of forming the back side high voltage integrated circuit 4 is not affected by the process of forming the switching element 1 and the processes can be optimized with an emphasis placed on improvements of the performance and the degree of integration of the integrated circuit. Therefore, the performance and the degree of integration of the integrated circuit can be improved.

Furthermore, the conductive board 3 on which the switching element 1 is mounted not only electrically connects the switching element 1 with the outside but also functions as a heat sink that radiates heat generated on the switching element 1. It is possible to reduce the thickness of the element by mounting the switching element 1 and the back side high voltage integrated circuit 4 on the conductive board 3 instead of mounting the integrated circuit on the switching element 1 as in the conventional case. Therefore, it is possible to realize integration between the switching element and the integrated circuit without deteriorating the heat radiation characteristic.

The thickness of the conductive board 3 may be increased for effective heat radiation. However, heat conduction in the planar direction of the conductive board 3 also influences radiation a great deal. Therefore, to improve the heat radiation characteristic, the area of the whole conductive board 3 needs to be sufficiently greater than the mounting area of the switching element 1.

Furthermore, since the back side high voltage integrated circuit 4 is mounted in the vicinity of the switching element 1 on the conductive board 3, it is thermally strongly coupled with the switching element 1 through the conductive board 3. Therefore, when an overheating protection circuit which detects an extraordinary heating condition of the switching element 1 and performs a protection operation is formed in the back side high voltage integrated circuit 4, this overheating protection circuit has an advantage of easily obtaining the accuracy of temperature detection.

Embodiment 2

A power semiconductor device according to Embodiment 2 of the present invention will be explained with reference to drawings. Here, explanations will be focused on differences from Embodiment 1.

Figure 5:
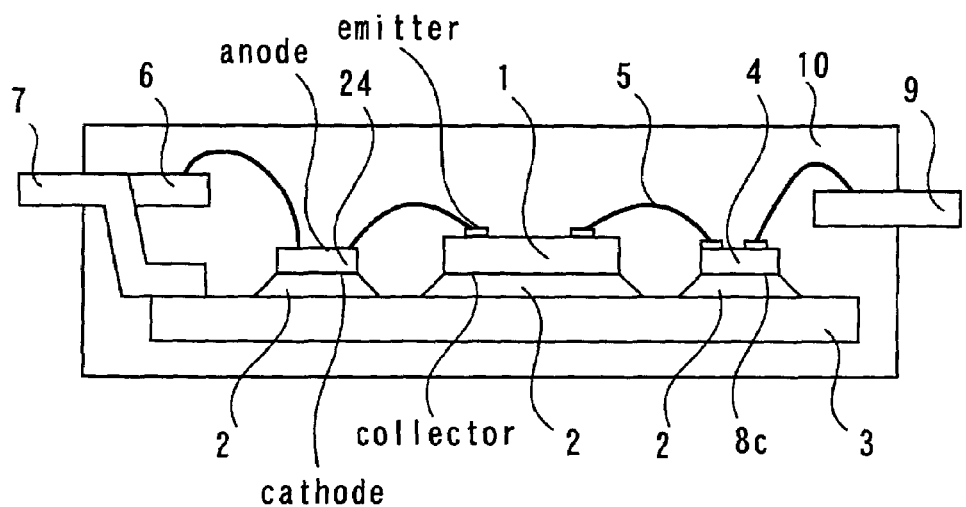
FIG. 5 is a side view showing a power semiconductor device according to Embodiment 2 of the present invention.
Figure 6:
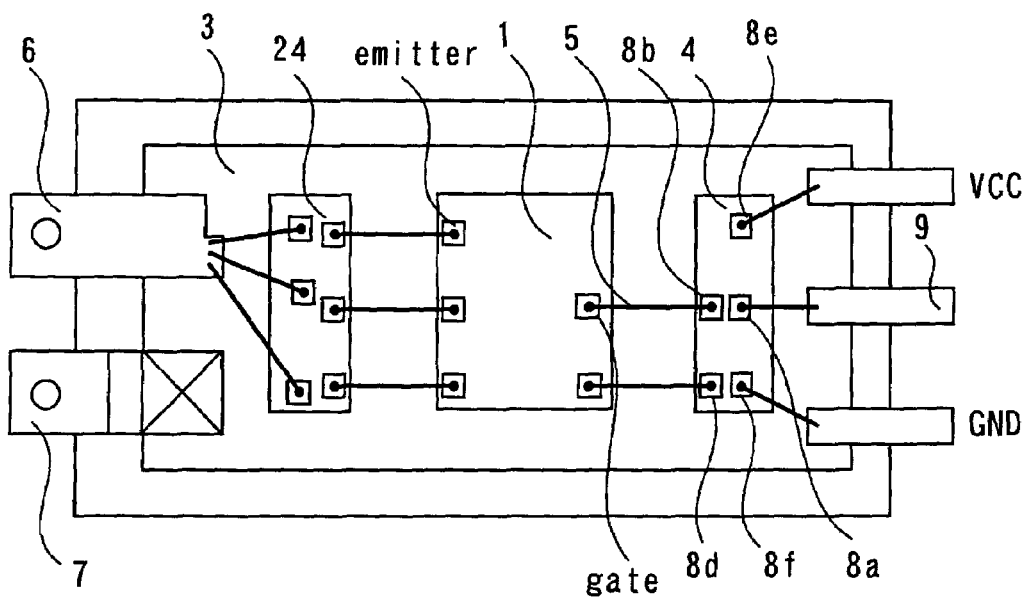
FIG. 6 is a top view showing a power semiconductor device according to Embodiment 2 of the present invention.

FIG. 5 is a side view showing a power semiconductor device according to Embodiment 2 of the present invention and FIG. 6 is a top view thereof. A freewheel diode 24 is mounted on a conductive board 3 via a conductive junction member 2 such as solder at a distance from a switching element 1 and a back side high voltage integrated circuit 4.

Figure 7:
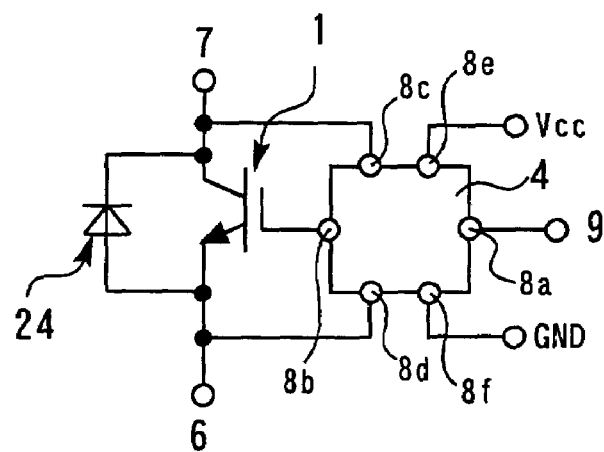
FIG. 7 is a circuit diagram showing the power semiconductor device according to Embodiment 2 of the present invention.

FIG. 7 is a circuit diagram showing the power semiconductor device according to Embodiment 2 of the present invention. The anode of the freewheel diode 24 is connected to the emitter of the switching element 1 and the cathode of the freewheel diode 24 is connected to the collector of the switching element 1. That is, the freewheel diode 24 is connected in parallel to the switching element 1. The rest of the configuration is the same as that in Embodiment 1.

When a power MOSFET is used as the switching element 1, a parasitic diode exists between the drain and the source. When a current flows through this parasitic diode, this restrains the generation of a negative voltage in the drain with respect to the source. On the other hand, when an IGBT is used as the switching element 1, no such parasitic diode exists. Therefore, this embodiment provides the freewheel diode 24 for each switching element 1 individually.

Figure 8:
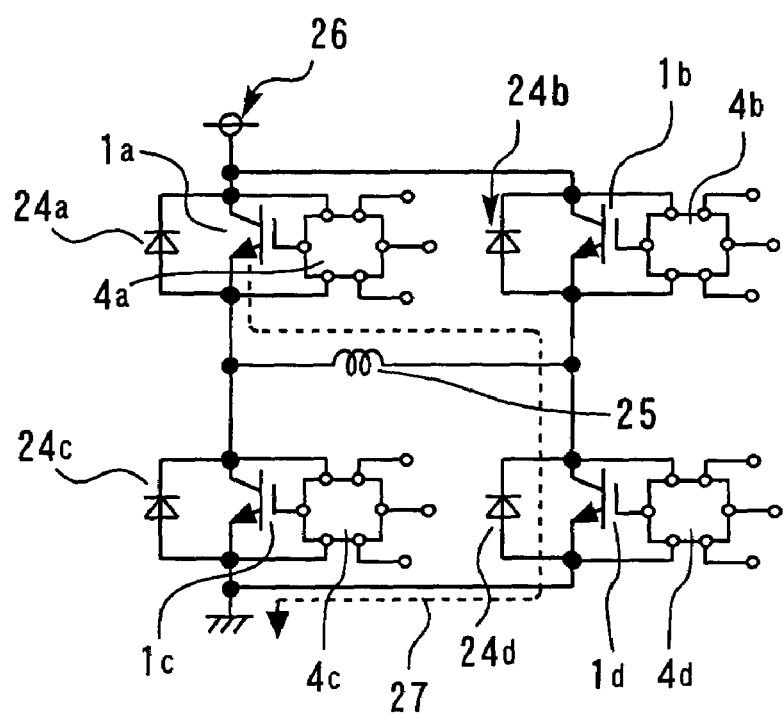
FIG. 8 is a circuit diagram showing a bridge circuit constructed using a plurality of switching elements.

FIG. 8 is a circuit diagram showing a bridge circuit constructed using a plurality of switching elements. The bridge circuit has a plurality of switching elements 1a to 1d, back side high voltage integrated circuits 4a to 4d provided for the respective switching elements 1a to 1d, freewheel diodes 24a to 24d, an inductive load 25 and a power supply 26.

When the switching elements 1a, 1d are ON and the switching element 1b, 1c are OFF, the current which passes through the inductive load 25 flows along a current path 27. When the switching elements 1a, 1d are turned OFF, the energy accumulated in the inductive load 25 is discharged, and therefore negative voltages are generated at the collectors with respect to the emitters of the switching elements 1a, 1d. In this case, it is feared that the potentials of the front side and the back side of the back side high voltage integrated circuits 4a, 4d may be reversed and a current may flow from the front side to the back side of the back side high voltage integrated circuits 4a, 4d. However, the accumulated energy of the inductive load 25 is discharged through the freewheel diodes 24a, 24d provided in parallel to the switching elements 1a, 1d and the above described negative voltage can be suppressed.

Embodiment 3

When the load is short-circuited due to anomalies in control of the switching element, excessive power loss may occur in the switching element and abnormal heat may be generated, which may cause damage to the element. Therefore, when a short circuit condition is detected, the switching element needs to be turned OFF immediately. Therefore, this embodiment 3 provides a back side voltage detection device for a back side high voltage integrated circuit and detects a collector voltage of a switching element 1.

Figure 9:
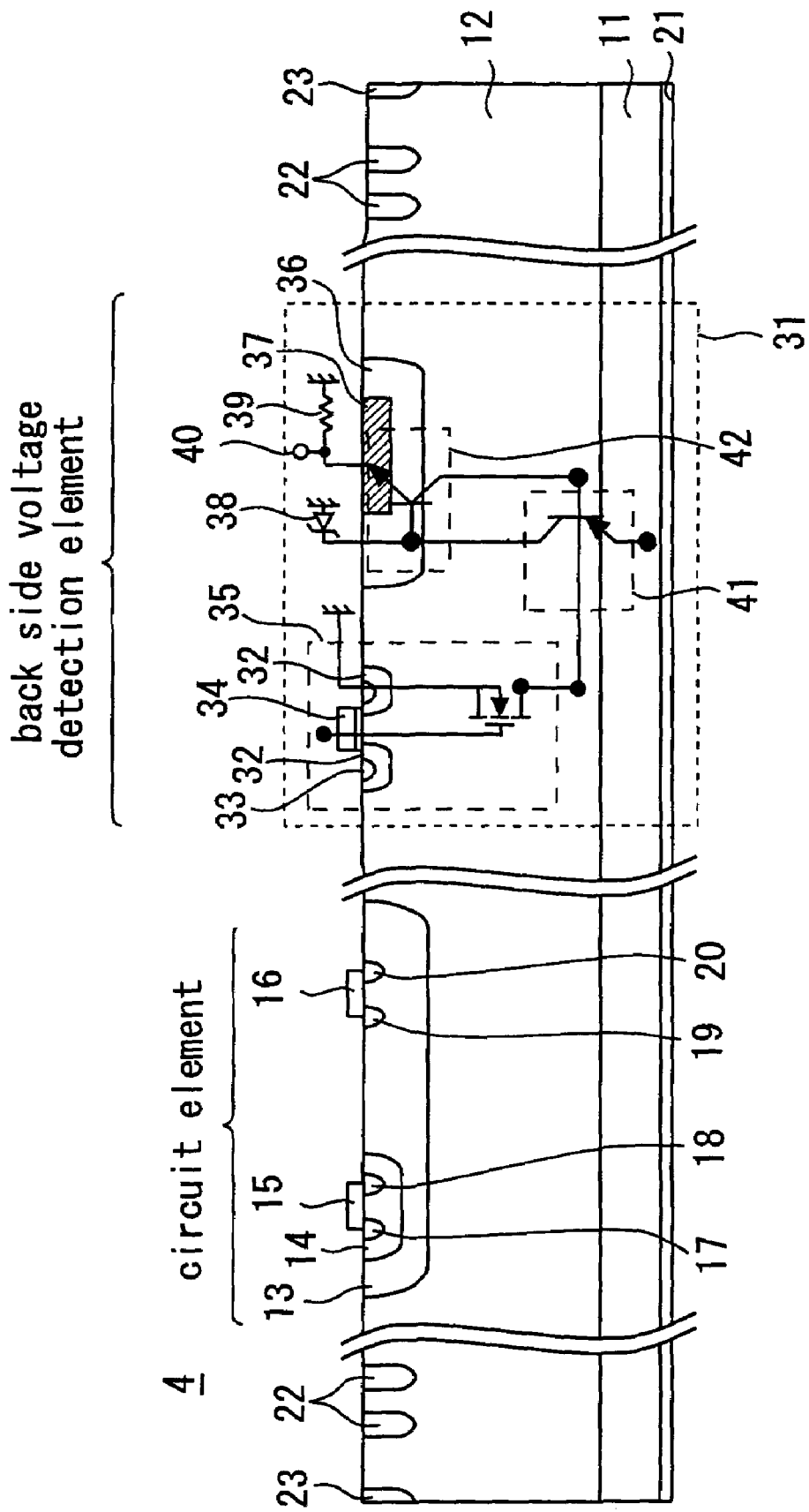
FIG. 9 is a cross-sectional view showing a back side high voltage integrated circuit according to Embodiment 3 of the present invention.

FIG. 9 is a cross-sectional view showing a back side high voltage integrated circuit according to Embodiment 3 of the present invention. A back side voltage detection element 31 and other circuit elements are formed on an identical substrate using a junction isolation technique. The back side voltage detection element 31 is not required to have performance comparable to that of the switching element 1. Therefore, the process of forming a back side high voltage integrated circuit 4 can be optimized to one with an emphasis placed on improvements of the performance of the circuit element and the degree of integration even if the performance of the back side voltage detection element 31 is degraded. Therefore, it is possible to improve the performance and the degree of integration of the integrated circuit.

A p-type semiconductor layer 11 is electrically connected to a conductive board 3 through a back side electrode 21. An n-type semiconductor layer 12 is provided on this p-type semiconductor layer 11. First p-type diffusion layers 32 are provided on the surface of the n-type semiconductor layer 12. A first n-type diffusion layer 33 is provided on a part of the first p-type diffusion layer 32. A gate 34 is provided on the surface of the first p-type diffusion layer 32 interposed between the n-type semiconductor layer 12 and the first n-type diffusion layer 33 through a gate oxide film. An insulated gate bipolar transistor 35 (which may also be referred to as "n-channel type DMOS (Double diffused Metal Oxide Semiconductor) transistor") is composed of this first p-type diffusion layer 32, first n-type diffusion layer 33 and gate 34. The first p-type diffusion layer 32 and the first n-type diffusion layer 33 are connected to the emitter of the switching element 1.

A second p-type diffusion layer 36 is provided on the surface of the n-type semiconductor layer 12 at a distance from the insulated gate bipolar transistor 35. A second n-type diffusion layer 37 is provided on the surface of the second p-type diffusion layer 36. Furthermore, the cathode of a zener diode 38 is connected to the second p-type diffusion layer 36 and the anode is grounded. Furthermore, a resistor 39 is provided between the second n-type diffusion layer 37 and a grounding point and the point of connection of both is connected to an output terminal 40. This zener diode 38 and the resistor 39 are formed on a substrate identical to that of the insulated gate bipolar transistor 35 or the like.

A PNP transistor 41 is composed of the p-type semiconductor layer 11, n-type semiconductor layer 12 and second p-type diffusion layer 36. Furthermore, an NPN transistor 42 is composed of the n-type semiconductor layer 12, second p-type diffusion layer 36 and second n-type diffusion layer 37.

When a positive voltage is applied to the gate 34, the insulated gate bipolar transistor 35 turns ON and a channel is formed on the surface of the first p-type diffusion layer 32. A current flows from the n-type semiconductor layer 12 to the insulated gate bipolar transistor 35. This current becomes a base current of the PNP transistor 41, drives the PNP transistor 41 and a collector current is generated at the driven PNP transistor 41. This collector current becomes a base current of the NPN transistor 42 and drives the NPN transistor 42.

The base current of the NPN transistor 42 is amplified and further increases the base current of the PNP transistor 41. That is, a thyristor to which positive feedback is applied is composed. When the insulated gate bipolar transistor 35 is turned ON, this thyristor operates. On the other hand, when the insulated gate bipolar transistor 35 is turned OFF, this thyristor stops after annihilation of a small number of carriers inside the substrate.

When the insulated gate bipolar transistor 35 turns ON, the voltage of the second n-type diffusion layer 37 is outputted from the output terminal 40 as the output voltage of the back side voltage detection element 31. This output voltage is inputted to another circuit element provided for the back side high voltage integrated circuit 4.

When this output voltage is inputted to the circuit element as is, an excessive current may flow and destroy the circuit element. However, the zener diode 38 does not cause the base voltage of the NPN transistor 42 to rise to or above a predetermined level. Therefore, it is possible to restrain positive feedback of the thyristor and restrain the output voltage of the back side voltage detection element 31. When the voltage of output terminal 40 is equal to or below the base voltage, this causes the voltage of the output terminal 40 to become substantially equal to the collector voltage when the switching element 1 is turned ON.

Figure 10:
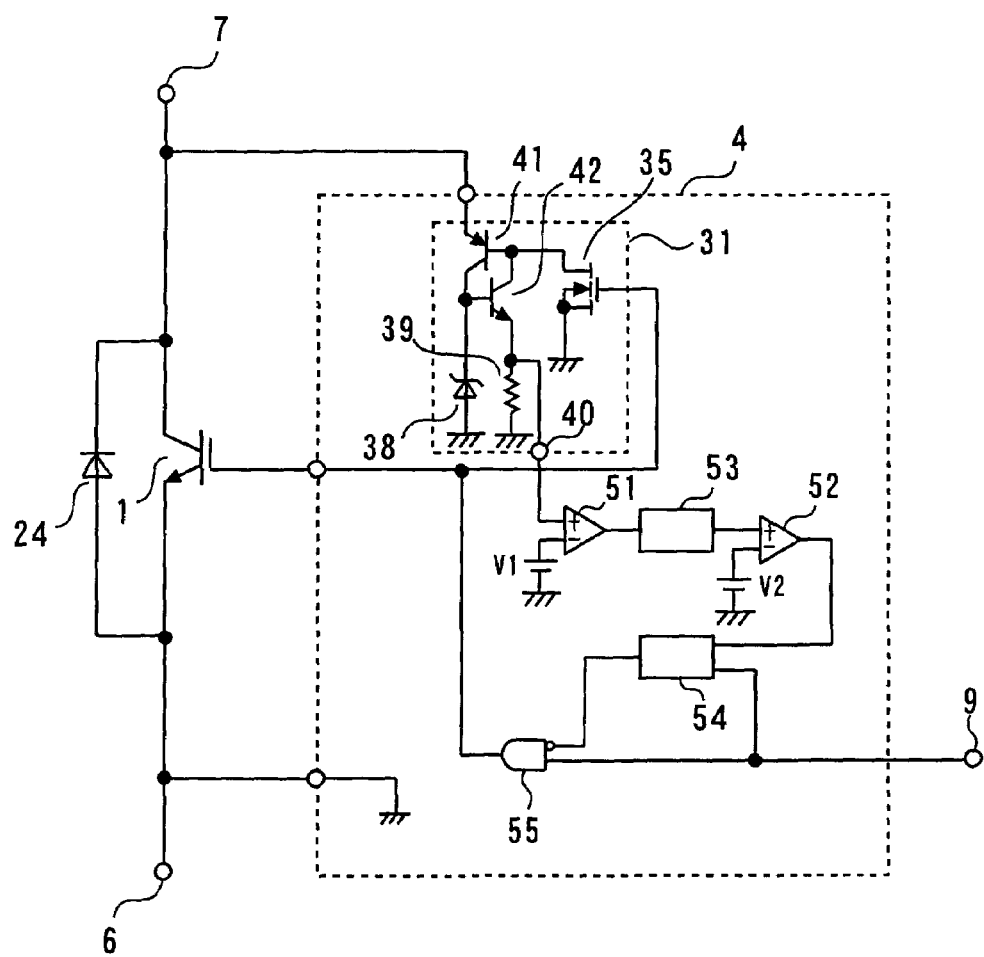
FIG. 10 shows a circuit diagram showing the power semiconductor device according to Embodiment 3 of the present invention.

FIG. 10 shows a circuit diagram showing the power semiconductor device according to Embodiment 3 of the present invention. The back side high voltage integrated circuit 4 has the above described back side voltage detection element 31, comparators 51, 52, an integration circuit 53, a latch circuit 54 and a logic circuit 55.

The comparator 51 (comparison circuit) outputs HIGH (OFF signal) when the output voltage outputted from the output terminal 40 of the back side voltage detection element 31 is greater than a predetermined voltage V1. The integration circuit 53 integrates the logic value of the output voltage of the comparator 51. The comparator 52 outputs HIGH when the output voltage of the integration circuit 53 is higher than a predetermined voltage V2. In this way, using the integration circuit 53 makes it possible to detect that the period during which the output voltage of the back side voltage detection element 31 exceeds the predetermined voltage V1 has exceeded a predetermined time.

The latch circuit 54 latches the output voltage of the comparator 52 according to a control signal inputted through a lead terminal 9 from outside. That is, the latch circuit 54 outputs HIGH when the output voltage of the comparator 52 is HIGH and maintains the logic until the control signal becomes LOW.

The logic circuit 55 outputs HIGH only when the control signal inputted from outside is HIGH and the output voltage of the latch circuit 54 is LOW. In this case, the switching element 1 and the insulated gate bipolar transistor 35 incorporated in the back side voltage detection element 31 turn ON. In other words, when the output voltage of the back side voltage detection element 31 is greater than a predetermined voltage, the logic circuit 55 turns OFF the switching element 1 regardless of the control signal inputted from outside.

Figure 11:
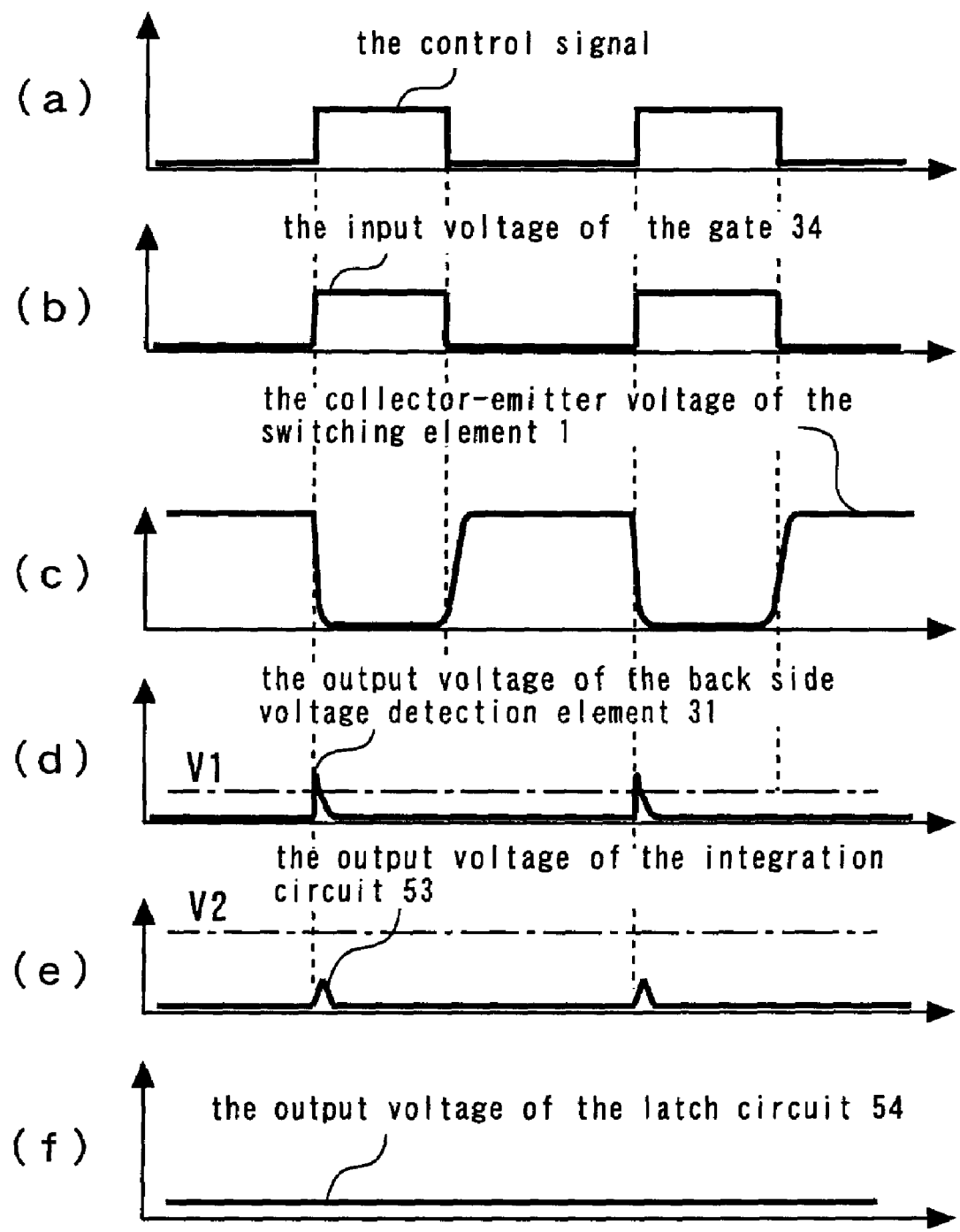
FIG. 11 shows timing charts at the respective sections of the circuit in FIG. 10 in a normal condition.

FIG. 11 shows timing charts at the respective sections of the circuit in FIG. 10 in a normal condition. In a normal condition, as shown in FIG. 11(c), when the switching element 1 turns ON, the collector-emitter voltage drops. For this reason, as shown in FIG. 11(d), the output voltage of the back side voltage detection element 31 becomes high only for an extremely short time during which the switching element 1 switches from OFF to ON. Therefore, as shown in FIG. 11(e), the output voltage of the integration circuit 53 becomes lower than the predetermined voltage V2.

Figure 12:
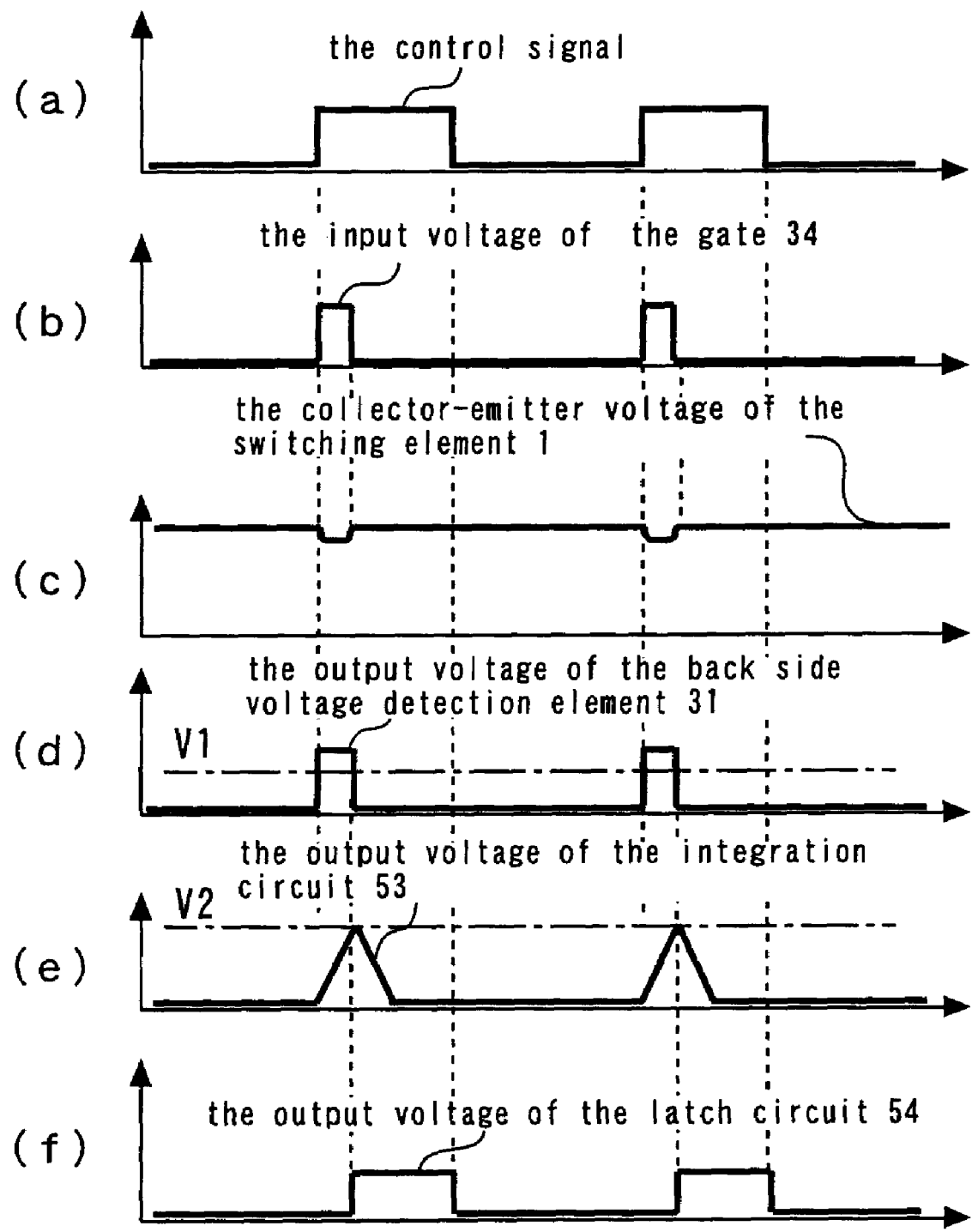
FIG. 12 shows operation waveforms at the respective sections of the circuit in FIG. 10 when the load is short-circuited.

FIG. 12 shows operation waveforms at the respective sections of the circuit in FIG. 10 when the load is short-circuited. When the load is short-circuited, even if the current flows, a voltage drop is less likely to occur and for this reason, as shown in FIG. 12(c), the collector-emitter voltage is less likely to drop. For this reason, as shown in FIG. 12(d), the output voltage of the back side voltage detection element 31 increases for a period during which the switching element 1 is ON and the period during which the predetermined V1 is exceeded also becomes longer. Therefore, as shown in FIG. 12(e), the output voltage of the integration circuit 53 increases. When the output voltage of the integration circuit 53 exceeds the predetermined voltage V2, the output voltage of the comparator 52 becomes HIGH and this is inputted to the latch circuit 54. As shown in FIG. 12(f), this causes the output voltage of the latch circuit 54 to become HIGH and maintain HIGH until the control signal becomes LOW. When the output voltage of the latch circuit 54 becomes HIGH, the output voltage of the logic circuit 55 becomes LOW and the switching element 1 turns OFF.

Here, in a normal condition, a sufficient current flows through the load a predetermined time after the switching element 1 is turned ON, the collector-emitter voltage of the switching element 1 drops and reaches saturation. However, when the load is short-circuited, the collector-emitter voltage does not drop even after a lapse of a predetermined time and the switching element 1 passes a current corresponding to the own capacity. Therefore, when the period during which the output voltage of the back side voltage detection element 31 exceeds the predetermined voltage V1 becomes longer than the predetermined time, the back side high voltage integrated circuit 4 regards this as a short-circuited condition and causes the switching element 1 to turn OFF. This allows the switching element 1 to be protected.

Embodiment 4

A power semiconductor device according to Embodiment 4 of the present invention will be explained with reference to drawings. Here, explanations will be focused on differences from Embodiment 3.

Figure 13:
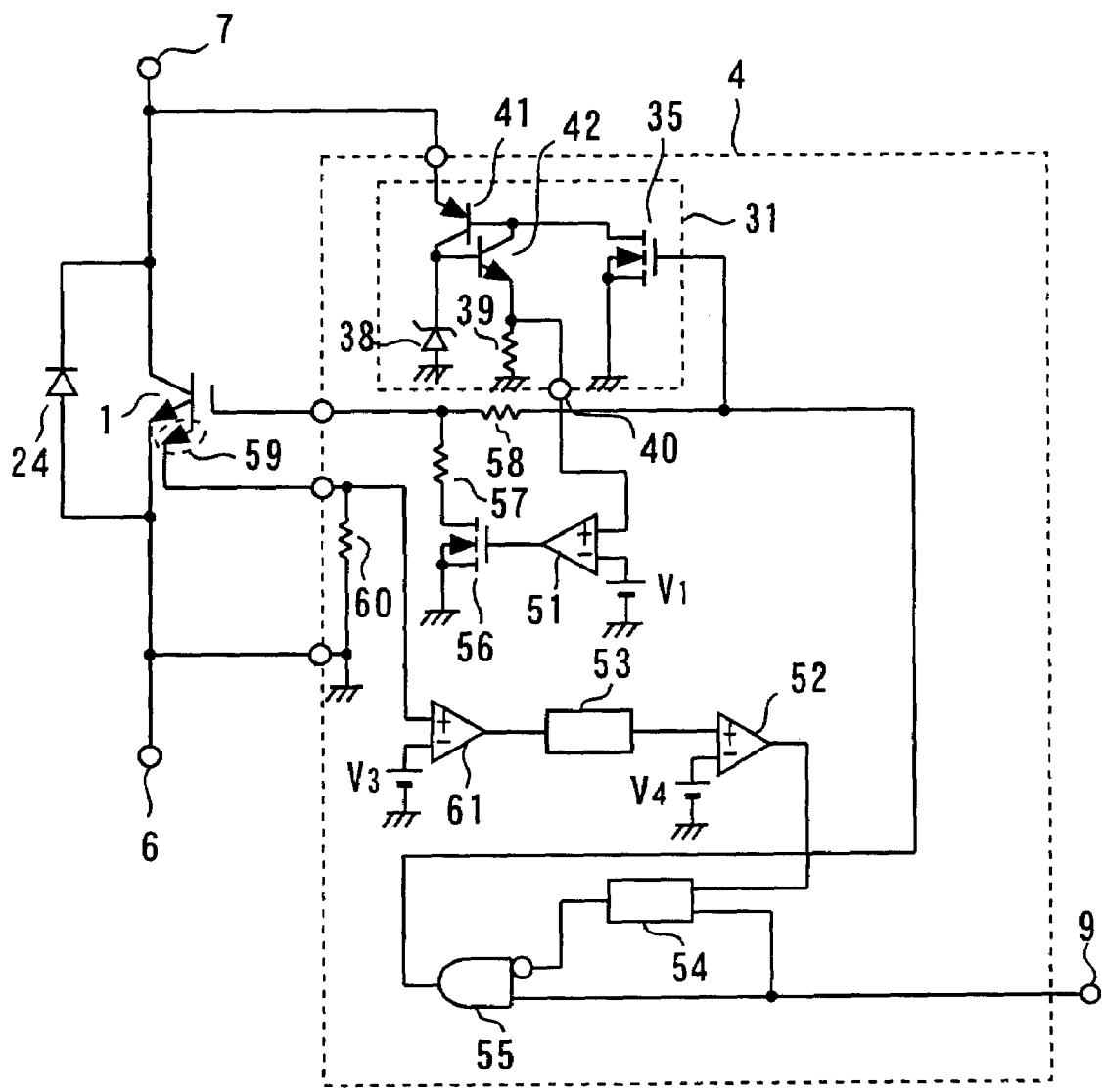
FIG. 13 is a circuit diagram showing a power semiconductor device according to Embodiment 4 of the present invention.

FIG. 13 is a circuit diagram showing a power semiconductor device according to Embodiment 4 of the present invention. A comparator 51 (first comparison circuit) outputs HIGH (drop signal) when the output voltage of a back side voltage detection element 31 is greater than a predetermined voltage V1. The gate of an NMOS transistor 56 (voltage dropping circuit) is connected to the output of a comparator 51, the drain is connected to the gate of a switching element 1 through a resistor 57 and the source is grounded. The output end of a logic circuit 55 is connected to the gate of the switching element 1 through a resistor 58.

When the output voltage of the back side voltage detection element 31 is greater than the predetermined voltage V1, the NMOS transistor 56 turns ON. In this case, by a resistive voltage division of the resistors 57, 58, the gate voltage of the switching element 1 becomes lower than the output voltage of the logic circuit 55. This can prevent an excessive voltage to be applied to the switching element 1.

A small current sensing element 59 (current sensing means) having a structure similar to that of the switching element 1 is provided inside the switching element 1. This current sensing element 59 passes a micro current in proportion to the magnitude of the current which flows through the switching element 1. A resistor 60 (conversion means) for converting the current outputted from the current sensing element 59 to a voltage is provided for the back side high voltage integrated circuit 4.

A comparator 61 (second comparison circuit) outputs HIGH (OFF signal) when the output voltage of the resistor 60 is greater than a predetermined voltage V3. An integration circuit 53 integrates the logic value of the output voltage of the comparator 61. A comparator 52 outputs HIGH when the output voltage of the integration circuit 53 is higher than a predetermined voltage V4. Use of the integration circuit 53 in this way makes it possible to detect that the period during which the output voltage of the resistor 60 exceeds the predetermined voltage V3 becomes longer than a predetermined time.

A latch circuit 54 latches the output voltage of the comparator 52 according to a control signal inputted through a lead terminal 9 from outside. That is, the latch circuit 54 outputs HIGH when the output voltage of the comparator 52 is HIGH and maintains the logic until the control signal becomes LOW.

The logic circuit 55 outputs HIGH only when the control signal inputted from outside is HIGH and the output voltage of the latch circuit 54 is LOW. In this case, the switching element 1 and an insulated gate bipolar transistor 35 incorporated in the back side voltage detection element 31 turn ON. In other words, the logic circuit 55 causes the switching element 1 to turn OFF regardless of the control signal inputted from outside when the output voltage of the resistor 60 is greater than the predetermined voltage.

In the above described configuration, the current sensing element 59 detects a current which flows through the switching element 1, determines, when an excessive current equal to or above the predetermined value flows for a predetermined time or more, that the load is in a short-circuited condition and turns OFF the switching element 1. It is thereby possible to prevent the excessive current from flowing through the switching element 1.

In the IGBT, when the collector-emitter voltage is high and the collector current is high, excessive power loss occurs and the IGBT is more likely to be destroyed. On the other hand, this embodiment can provide protection in both aspects of current and voltage and thereby increase the level of safety.

Figure 14:
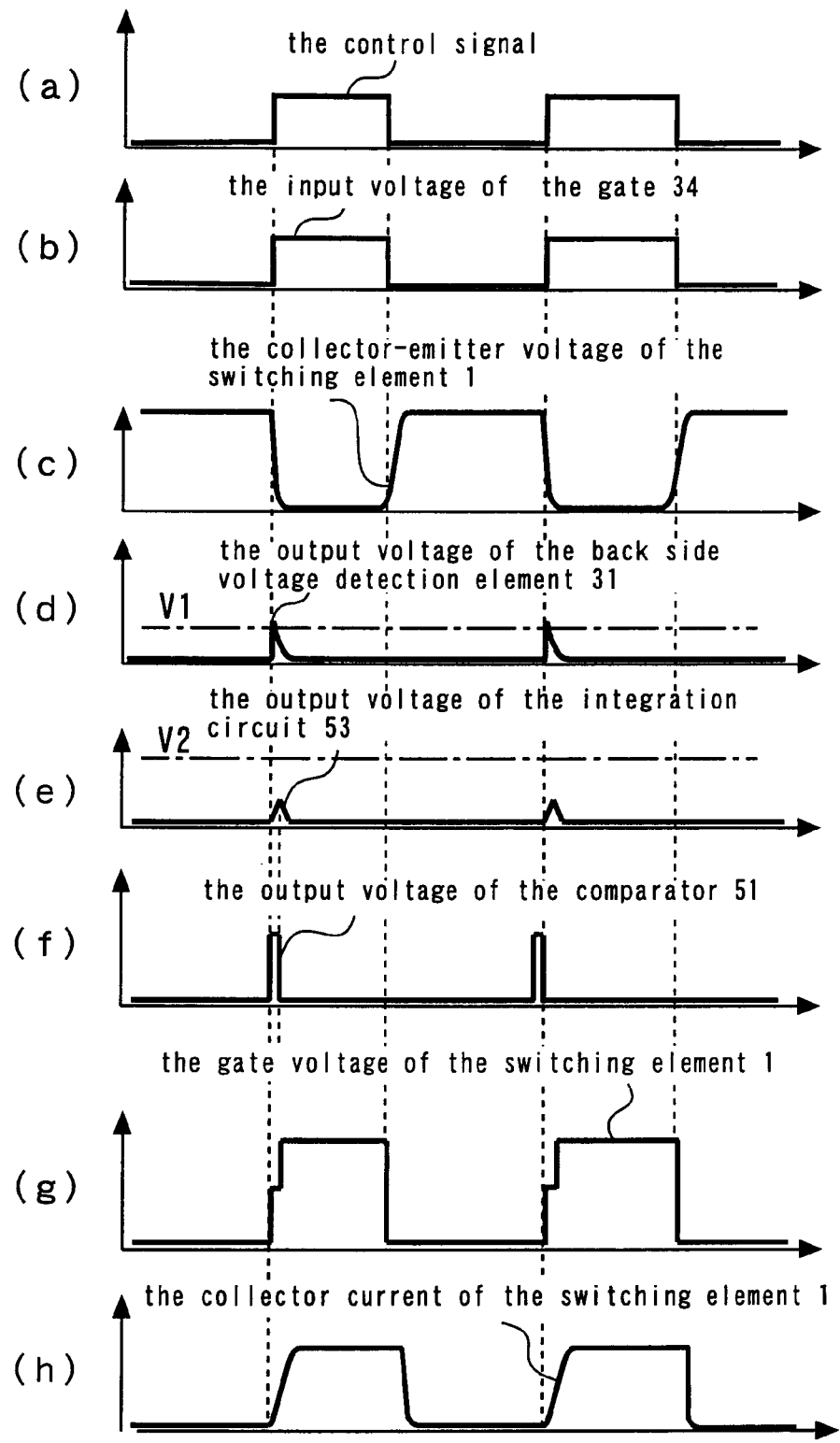
FIG. 14 shows timing charts of the respective sections of the circuit in FIG. 13 in a normal condition.

FIG. 14 shows timing charts of the respective sections of the circuit in FIG. 13 in a normal condition. The waveforms in FIG. 14 are the same as the waveforms in FIG. 11 shown in Embodiment 3.

As shown in FIG. 14(f), in a normal condition, the output voltage of the comparator 51 becomes HIGH for an extremely short time after the switching element 1 switches from OFF to ON. During this period, the NMOS transistor 56 is kept ON. As shown in FIG. 14(g), the gate voltage of the switching element 1 is limited to a low level immediately after the switching element 1 switches from OFF to ON. As shown in FIG. 14(h), this causes the collector current of the switching element 1 to be limited to a low level. When the output voltage of the comparator 51 becomes LOW, the NMOS transistor 56 turns OFF. The gate voltage of the switching element 1 increases and the collector current of the switching element 1 increases.

Figure 15:
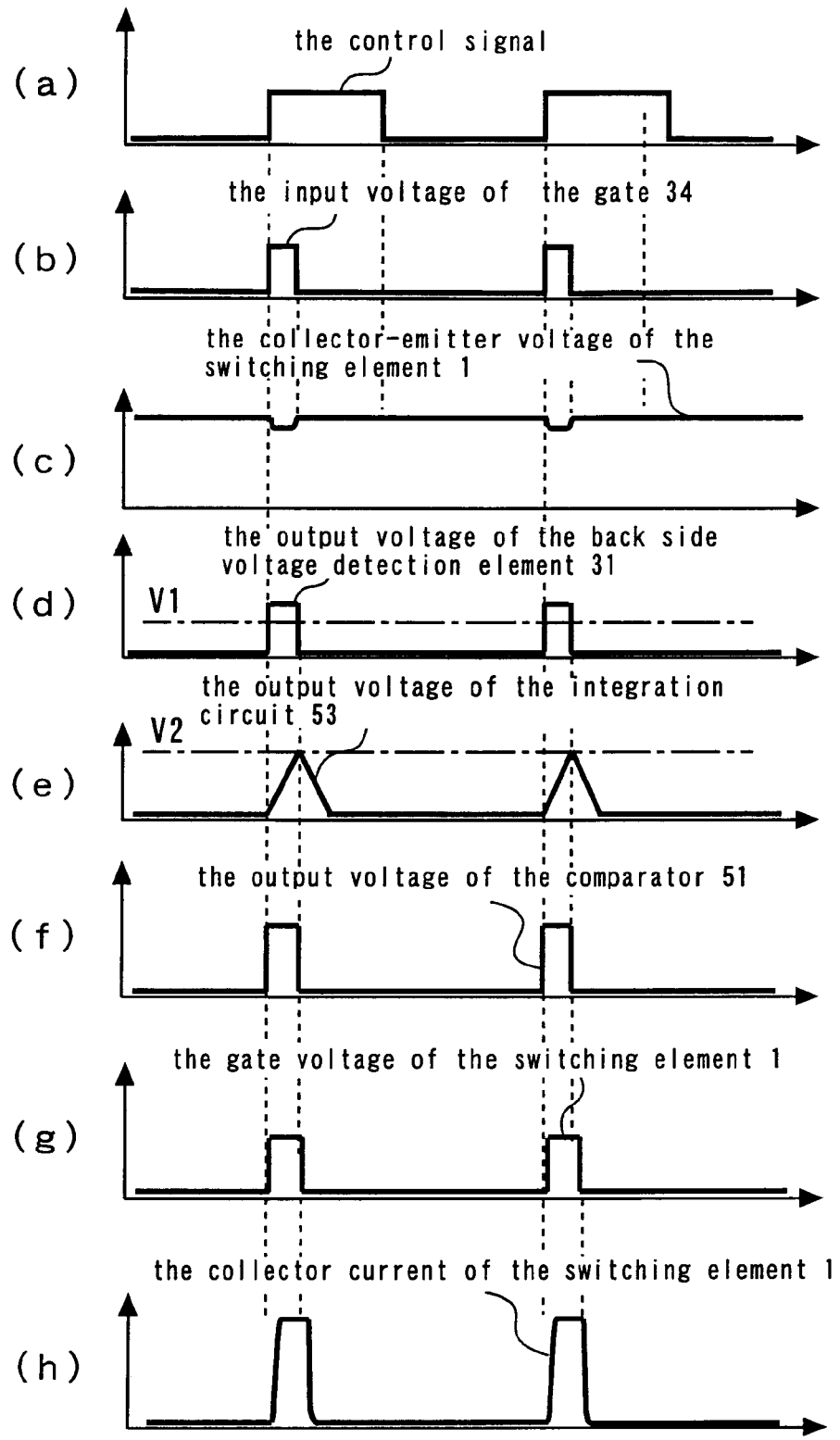
FIG. 15 shows timing charts at the respective sections of the circuit in FIG. 13 when the load is short-circuited.

FIG. 15 shows timing charts at the respective sections of the circuit in FIG. 13 when the load is short-circuited. The waveforms in FIG. 15 are the same as the waveforms in the FIG. 12 shown in Embodiment 3.

As shown in FIG. 15(f), when the load is short-circuited, the output voltage of the comparator 51 remains HIGH while the switching element 1 is ON. During this period, the NMOS transistor 56 remains ON. As shown in FIG. 15(g), the gate voltage of the switching element 1 is low while the switching element 1 is ON. As shown in FIG. 15(h), the switching element 1 turns OFF when the output voltage of the integration circuit 53 reaches a predetermined voltage V2 as in the case of Embodiment 3.

As described above, this embodiment provides the comparator 51 and the NMOS transistor 56, and can thereby suppress the gate voltage of the switching element 1 to a level lower than a normal condition. This can prevent an excessive current from flowing and destroying the switching element 1. This makes it possible to extend the period after the switching element 1 is caused to turn ON until it is caused to turn OFF due to the protection operation carried out by measuring a sense current. Therefore, it is possible to prevent the switching element 1 from turning OFF due to a wrong detection.

Embodiment 5

Figure 16:
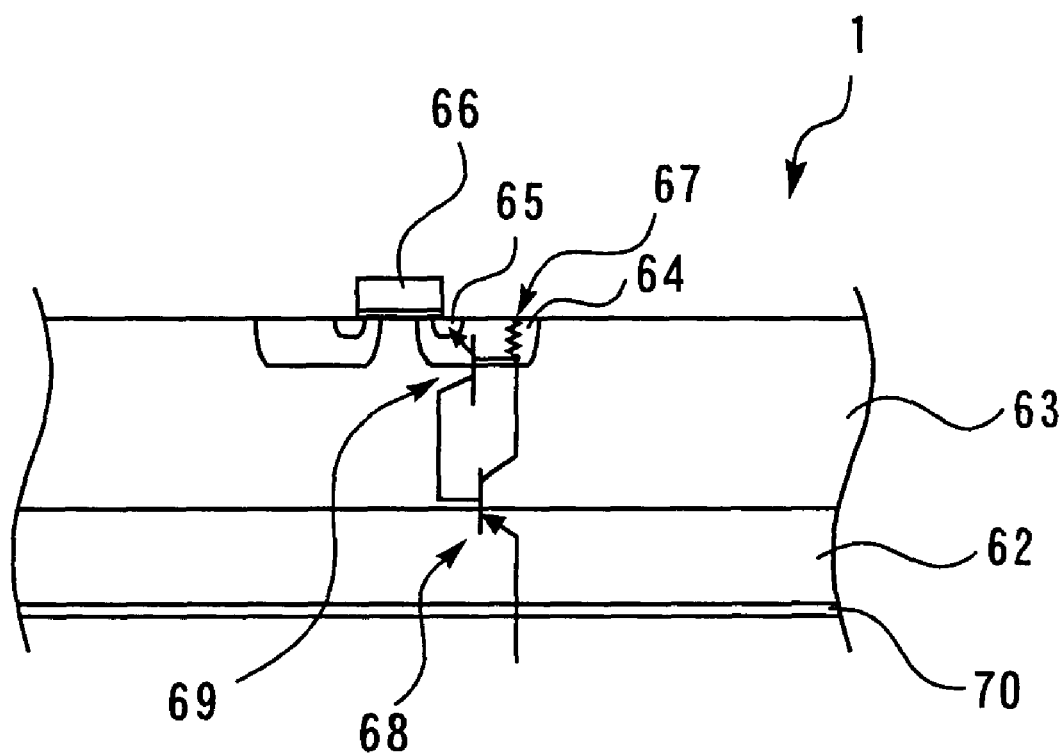
FIG. 16 is a cross-sectional view showing a switching element according to Embodiment 5 of the present invention.

FIG. 16 is a cross-sectional view showing a switching element according to Embodiment 5 of the present invention. An n-type semiconductor layer 63 is provided on a p-type semiconductor layer 62. A p-type diffusion layer 64 is provided on the surface of the n-type semiconductor layer 63. An n-type diffusion layer 65 is provided in a part of a p-type diffusion layer 64. A gate 66 is provided on the surface of the p-type diffusion layer 64 interposed between the n-type semiconductor layer 63 and n-type diffusion layer 65 through a gate oxide film. A back side electrode 70 is provided on the underside of the p-type semiconductor layer 62. The p-type diffusion layer 64 is connected to a grounding resistor 67. When such an IGBT is used as the switching element 1, a parasitic thyristor is composed of a PNP transistor 68 and an NPN transistor 69.

Since a greater current flows in a short-circuited condition than in a normal condition, drastically cutting off the switching element 1 causes a channel in the MOSFET section of the switching element 1 to disappear rapidly. Carriers in the vicinity of the switching element 1 have nowhere to go and flow into the switching element 1. A voltage drop thereby provoked may cause misoperation of the parasitic thyristor and cause the element to be destroyed by a latch up.

Therefore, this embodiment provides a switching circuit to switch the cutoff speed when cutting off the switching element 1 for the back side high voltage integrated circuit 4. With this switching circuit, the back side high voltage integrated circuit 4 slows down the cutoff speed of the switching element 1 compared to that during a normal operation when carrying out a protection operation of turning OFF the switching element 1. More specifically, as the cutoff circuit which cuts off the switching element 1, a cutoff circuit having lower driving performance than the cutoff circuit used for a normal operation is used during a protection operation. For example, the protection operation of the excessive current detection circuit according to Embodiment 4 is used for the protection operation.

Figure 17:
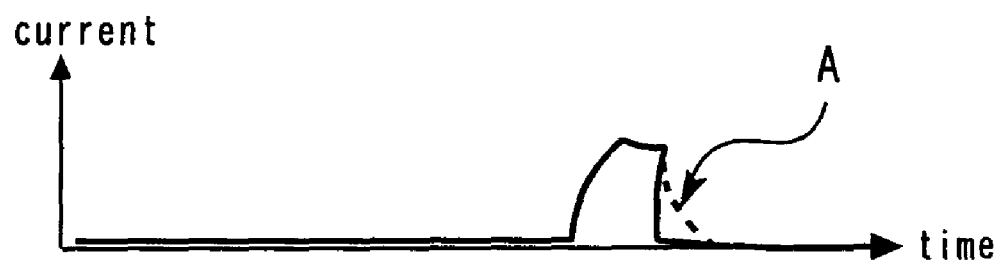
FIG. 17 shows a current waveform of the switching element when performing the protection operation of the power semiconductor device according to Embodiment 5 of the present invention.

FIG. 17 shows a current waveform of the switching element when performing the protection operation of the power semiconductor device according to Embodiment 5 of the present invention. Slowing down the cutoff speed in a protection operation causes the current flowing through the switching element at the time of cutoff to be one shown by dotted line A.

As described above, slowing down the cutoff speed of the switching element 1 during a protection operation can prevent the switching element from being destroyed due to a latch up.

Embodiment 6

Embodiment 2 constructs a bridge circuit by connecting a freewheel diode 24 to a switching element 1 in parallel and combining a plurality of switching elements, and thereby suppresses a negative voltage added to the collector. However, if the current direction is changed in a state in which a current is made to flow through an inductive load using the freewheel diode 24, an excessive voltage may be generated at the collector of the switching element 1 due to an operation delay of the diode.

Furthermore, when a zener diode is provided between the collector and the gate of the switching element to absorb an excessive surge added to the collector, the control circuit connected to the gate turns ON the switching element against the function of causing the switching element to turn OFF. Therefore, a current corresponding to the function against the operation of the control circuit flows through the zener diode. However, the control circuit which drives the large-capacity switching element has a high current driving capacity and the current flowing through the zener diode also increases, and therefore the zener diode provided on the switching element may be destroyed with the flow of an excessive current.

To avoid this, a snubber circuit using a large-capacity capacitor and resistor or the like is provided to absorb the surge. However, increasing the capacity of the capacitor of the snubber circuit to suppress generation of surge results in a problem of causing the current that flows during charge/discharge to increase and increasing power loss.

Figure 18:
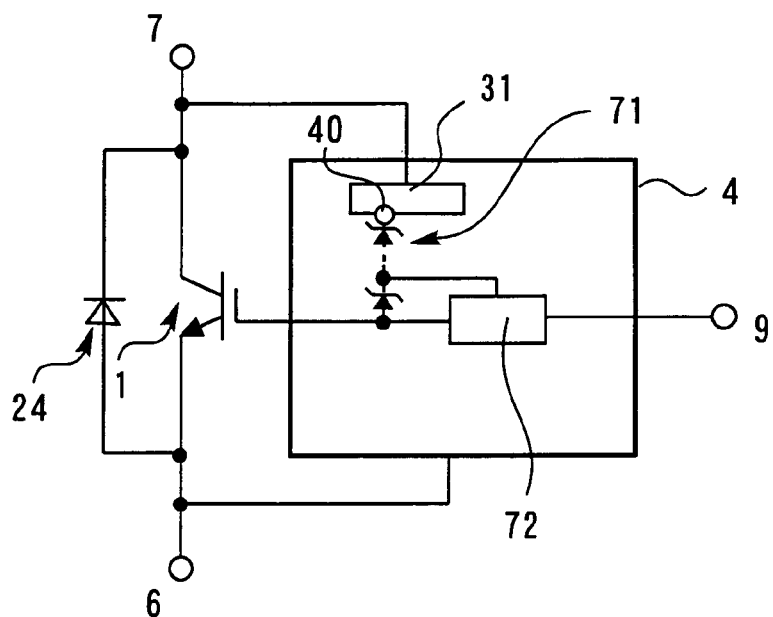
FIG. 18 is a circuit diagram showing a power semiconductor device according to Embodiment 6 of the present invention.

FIG. 18 is a circuit diagram showing a power semiconductor device according to Embodiment 6 of the present invention. A back side high voltage integrated circuit 4 is provided with a high voltage zener diode 71 connected between a switching element 1 and a back side voltage detection element 31, and a control circuit 72. The control circuit 72 drives the switching element 1 according to a control signal inputted to a lead terminal 9 from outside.

The control circuit 72 causes the switching element 1 to turn ON when the back side voltage detected by the back side voltage detection element 31 is higher than a predetermined voltage (hereinafter, referred to as an "activist clamp operation"). This can absorb an excessive transition voltage (surge) added to the gate of switching element. It is then possible to realize a reduction of the capacity of the snubber capacitor, a reduction of the number of parts and a reduction of power loss.

When the switching element 1 for a high current is used, the current driven by the control circuit 72 is large. Therefore, under the influence of a tiny inductive component that exists in the wiring between the control circuit 72 and the switching element 1, the back side voltage detection element 31 cannot perform correct voltage detection. However, by arranging the back side high voltage integrated circuit 4 in the vicinity of the switching element 1 on the conductive board 3, the distance between the control circuit 72 and switching element 1 can be narrowed. This allows the back side voltage detection element 31 to perform correct voltage detection.

Embodiment 7

Since a switching element for a high current has a large gate capacity, it is necessary to supply a transiently excessive current when the switching element switches from an OFF state to an ON state. Therefore, this embodiment 7 extracts a charge current that causes the gate voltage to rise from the collector. This configuration will be explained in detail below.

Figure 19:
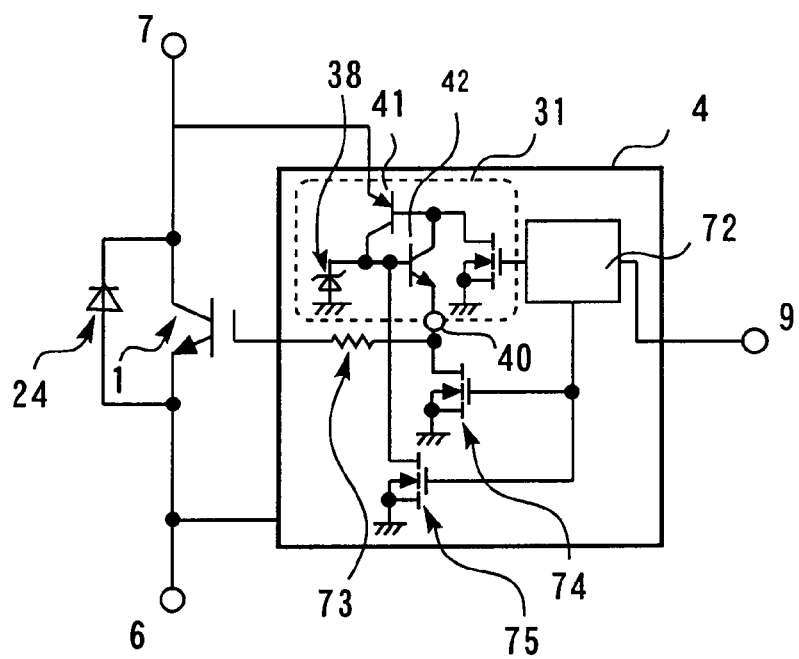
FIG. 19 is a circuit diagram showing a power semiconductor device according to Embodiment 7 of the present invention.

FIG. 19 is a circuit diagram showing a power semiconductor device according to Embodiment 7 of the present invention. A resistor 73 is provided between an output terminal 40 of a back side voltage detection element 31 and the gate of a switching element 1. The back side voltage detection element 31 supplies a charging current from the output terminal 40 to the gate of the switching element 1 through the resistor 73 when the switching element 1 switches from an OFF state to an ON state.

When the switching element 1 turns ON and reaches a saturated voltage, the back side voltage detection element 31 can no longer supply an enough current. Therefore, the back side voltage detection element 31 can give a charging current to the switching element 1 only when the collector-emitter voltage is high when the switching element 1 switches from an OFF state to an ON state. In this way, by supplying a charging current to the switching element 1 using the back side voltage detection element 31, it is possible to reduce the capacity of the power and reduce the capacity of the control circuit.

Furthermore, a cutoff transistor 74 is provided between the output terminal 40 of the back side voltage detection element 31 and a grounding point and a cutoff transistor 75 is provided between the base of an NPN transistor 42 of the back side voltage detection element 31 and a grounding point. The control circuit 72 controls the cutoff transistors 74 and 75, and can thereby prevent an excessive voltage from being supplied to the switching element 1.

Embodiment 8

When a bridge circuit is constructed by combining a plurality of switching elements, to drive a switching element on a high potential side, it is a general practice to use a power supply circuit which uses the emitter of the switching element as the reference potential. In this case, a current is supplied to the high potential side using a power transformer or the like and a DC voltage is generated using a rectification circuit and a smoothing capacitor or the like. The power semiconductor device according to this embodiment 8 can reduce such a power circuit on the high potential side. This configuration will be explained in detail below.

Figure 20:
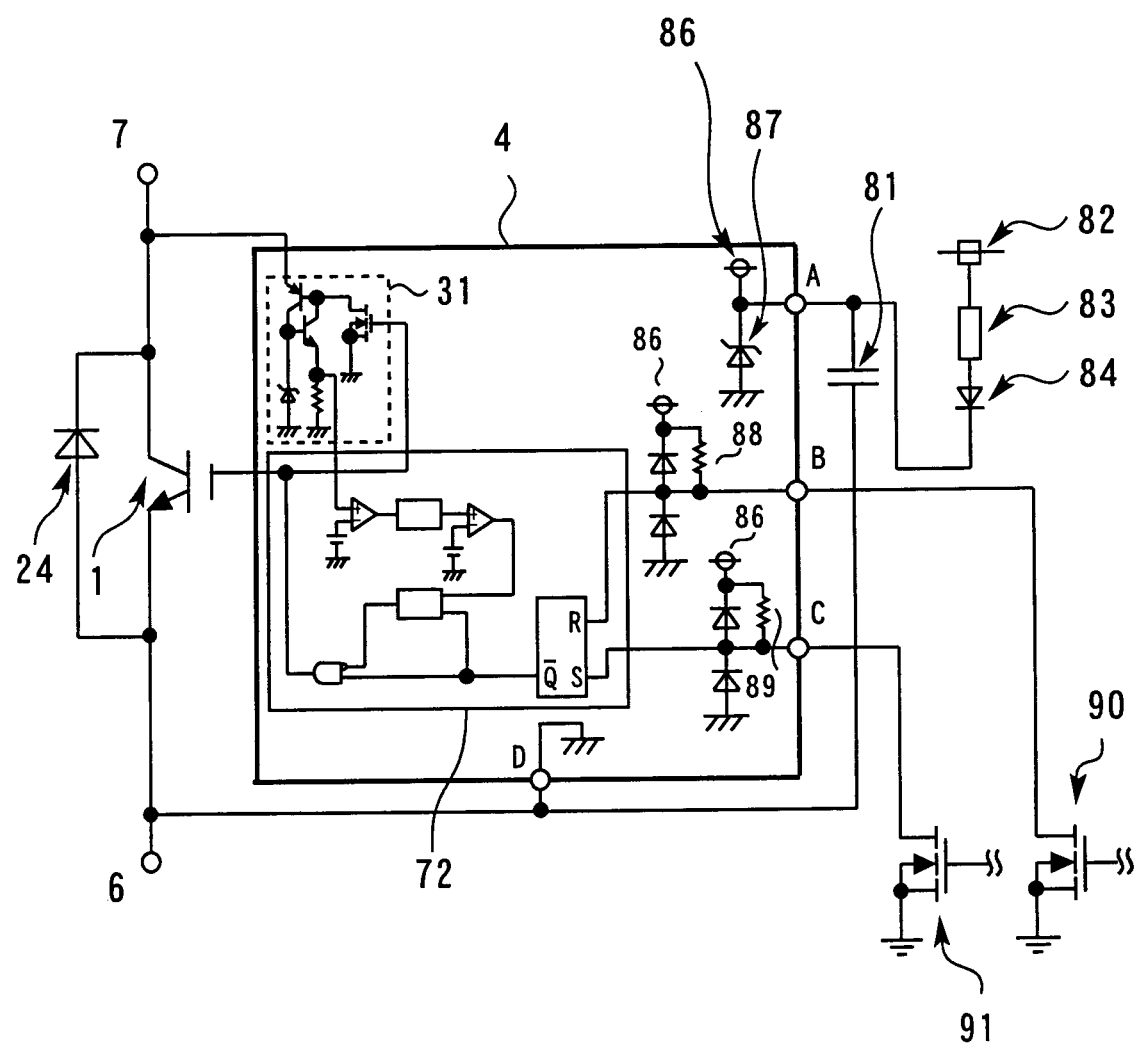
FIG. 20 is a circuit diagram showing a power semiconductor device according to Embodiment 8 of the present invention.

FIG. 20 is a circuit diagram showing a power semiconductor device according to Embodiment 8 of the present invention. The power semiconductor device in this FIG. 20 is used on the high potential side of the bridge circuit in FIG. 8. One end of a capacitor 81 is connected to the emitter of a switching element 1. A power supply 82 is connected to the other end of the capacitor 81 through a resistor 83 and a high voltage diode 84 and charges the capacitor 81. This power supply 82 is a power circuit on the low potential side using the emitter of the low potential side switching element as the reference.

When the switching element on the low potential side of the bridge circuit is turned ON, the emitter potential of the switching element 1 on the high potential side is reduced to a level comparable to the collector-emitter voltage of the switching element on the low potential side and becomes a voltage lower than that of the power supply 82. Therefore, the high voltage diode 84 is forward biased and charge is accumulated in the capacitor 81 through the resistor 83.

On the other hand, when the switching element on the low potential side is OFF and the switching element 1 on the high potential side is ON, the emitter potential of the switching element 1 approximates to the collector potential and approximates to the supply voltage of the bridge circuit. At this time, since the emitter of the switching element 1 has a higher potential than that of the power supply 82, the high voltage amount diode 84 is backward biased and no current flows. In this way, the switching element on the low potential side periodically turns ON, the emitter voltage of the switching element 1 on the high potential side thereby drops and the capacitor 81 is charged.

A back side high voltage integrated circuit 4 has a control circuit 72 connected to the gate of the switching element 1 and input terminals A, B, C. The other end of the capacitor 81 is connected to a terminal 86 in the back side high voltage integrated circuit 4 through an input terminal A. A zener diode 87 is provided between the terminal 86 and a grounding point.

The terminal 86 is connected to the point of connection between the input terminal B and the control circuit 72 through a resistor 88. Furthermore, another terminal 86 is connected to the point of connection between the input terminal C and the control circuit 72 through a resistor 89. This causes the input terminals B and C to be pulled up to the voltage charged in the capacitor 81. The input terminals B and C are connected to outside high voltage transistors 90 and 91 respectively.

The control circuit 72 absorbs currents from outside through the input terminals B and C and detects a voltage drop of the resistors 88 and 89. The control circuit 72 switches over to an ON operation when a signal is added to any one of the input terminals B and C and switches over to an OFF operation when a signal is added to the other. The control circuit 72 has a latch circuit to maintain the condition of the above operation.

In this way, the control circuit 72 operates with charge accumulated in the capacitor 81 and controls ON/OFF of the switching element 1. That is, charge accumulated in the capacitor 81 is used instead of the power supply for operating the control circuit 72. This allows the power circuit on the high potential side to be reduced.

Embodiment 9

The power semiconductor device according to this embodiment 9 will be explained. Here, explanations will be focused on differences from Embodiment 8.

Figure 21:
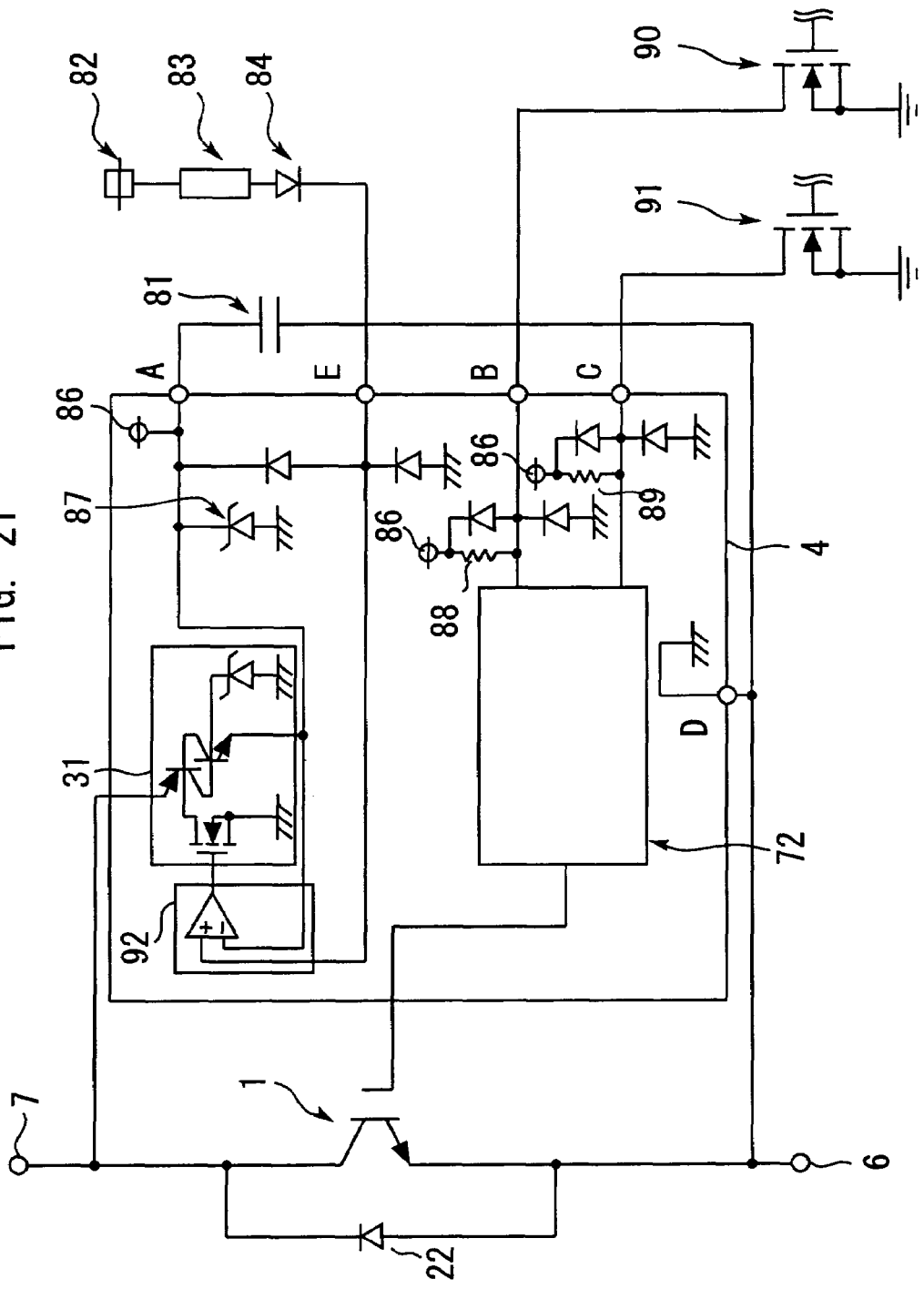
FIG. 21 is a circuit diagram showing a power semiconductor device according to Embodiment 9 of the present invention.

FIG. 21 is a circuit diagram showing a power semiconductor device according to Embodiment 9 of the present invention. A back side high voltage integrated circuit 4 is provided with the back voltage detection device 31 shown in Embodiment 3. This back side voltage detection element 31 is connected to the collector of a switching element 1 and a capacitor 81.

A first input terminal of a comparison circuit 92 is connected to a power supply 82 through a terminal E, a resistor 83 and a high voltage diode 84 and a second input terminal is connected to the other end of the capacitor 81. When the voltage of the second input terminal is lower than the voltage of the first input terminal, the comparison circuit 92 drives the back side voltage detection element 31. This causes a current to be supplied from the collector of the switching element 1 to the other end of the capacitor 81 through the back side voltage detection element 31 and causes the capacitor 81 to be charged.

Accordingly, the current necessary to charge the capacitor 81 need not be supplied from the comparison circuit 92 side. Therefore, the current capacity of the element provided on the comparison circuit 92 side can be lowered. Furthermore, it is also possible to shorten the time required for charging and shorten the waiting time until the driving of the load is started.

Embodiment 10

A power semiconductor device according to this embodiment 10 will be explained. Here, explanations will be focused on differences from Embodiment 8.

Figure 22:
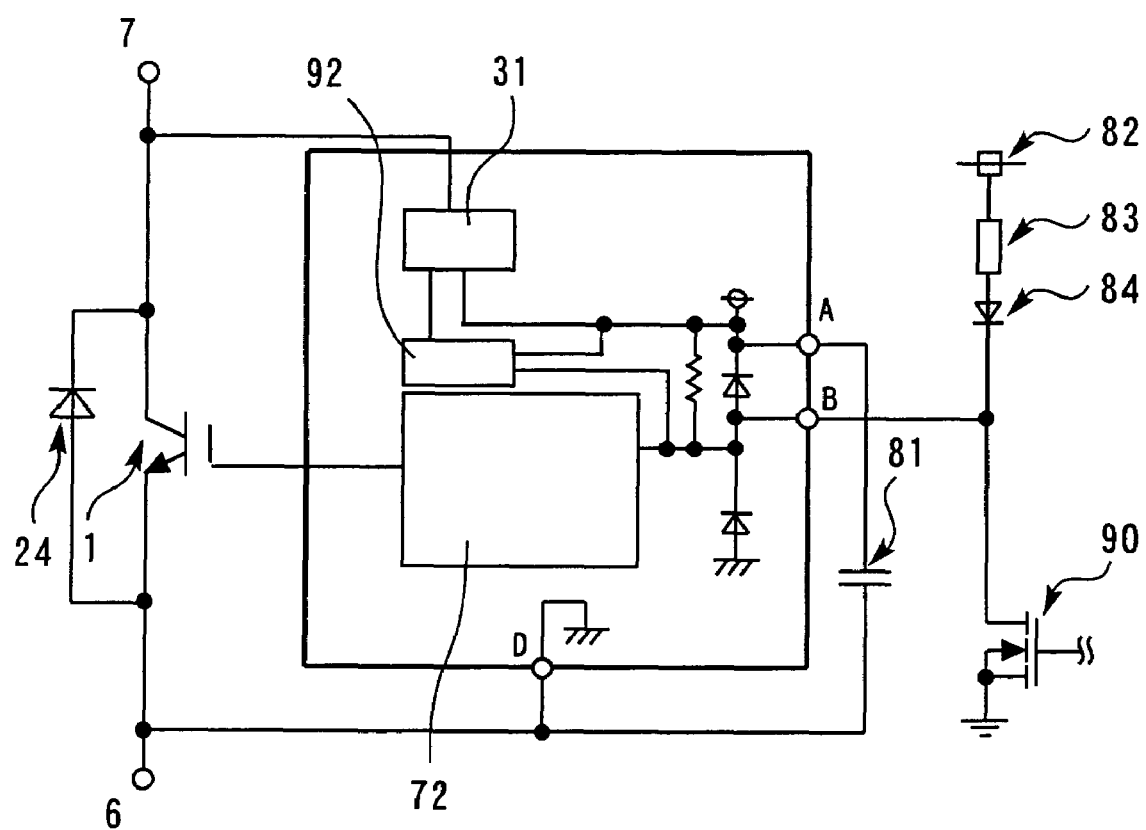
FIG. 22 is a circuit diagram showing a power semiconductor device according to Embodiment 10 of the present invention.

FIG. 22 is a circuit diagram showing a power semiconductor device according to Embodiment 10 of the present invention. A control circuit 72 has a timer circuit (not shown) and when the length of an input signal inputted from outside is equal to or more than a predetermined time, the control circuit 72 switches an ON/OFF operation of a switching element 1 after the input signal is inputted. This allows control of the ON/OFF operation of the switching element to be performed stably.

Furthermore, a terminals B is the only terminal that externally controls the control circuit 72 and the number of outside control terminals can be reduced compared to Embodiment 8. Therefore, this embodiment 10 can reduce the number of input signal lines for controlling ON/OFF to one and thereby reduce the cost required for wiring.

Embodiment 11

A power semiconductor device according to this embodiment 11 will be explained. Here, explanations will be focused on differences from Embodiment 10.

A control circuit 72 has two types of timer circuits (not shown) using a first time and a second time which is longer than the first time as the reference. The control circuit 72 does not switch an ON/OFF operation of a switching element 1 when the length of an input signal is less than the first time. Furthermore, when the length of the input signal is equal to or more than the first time and less than the second time, the control circuit 72 switches the switching element 1 from an OFF operation to an ON operation. Furthermore, when the length of the input signal is equal to or more than the second time, the control circuit 72 switches the switching element 1 from an ON operation to an OFF operation.

In this way, since the reference for the length of the input signal is set in two stages, control of the ON/OFF operation of the switching element can be performed more stably than Embodiment 10.

Embodiment 12

A power semiconductor device of this embodiment 12 will be explained. Here, explanations will be focused on differences from Embodiment 11.

Figure 23:
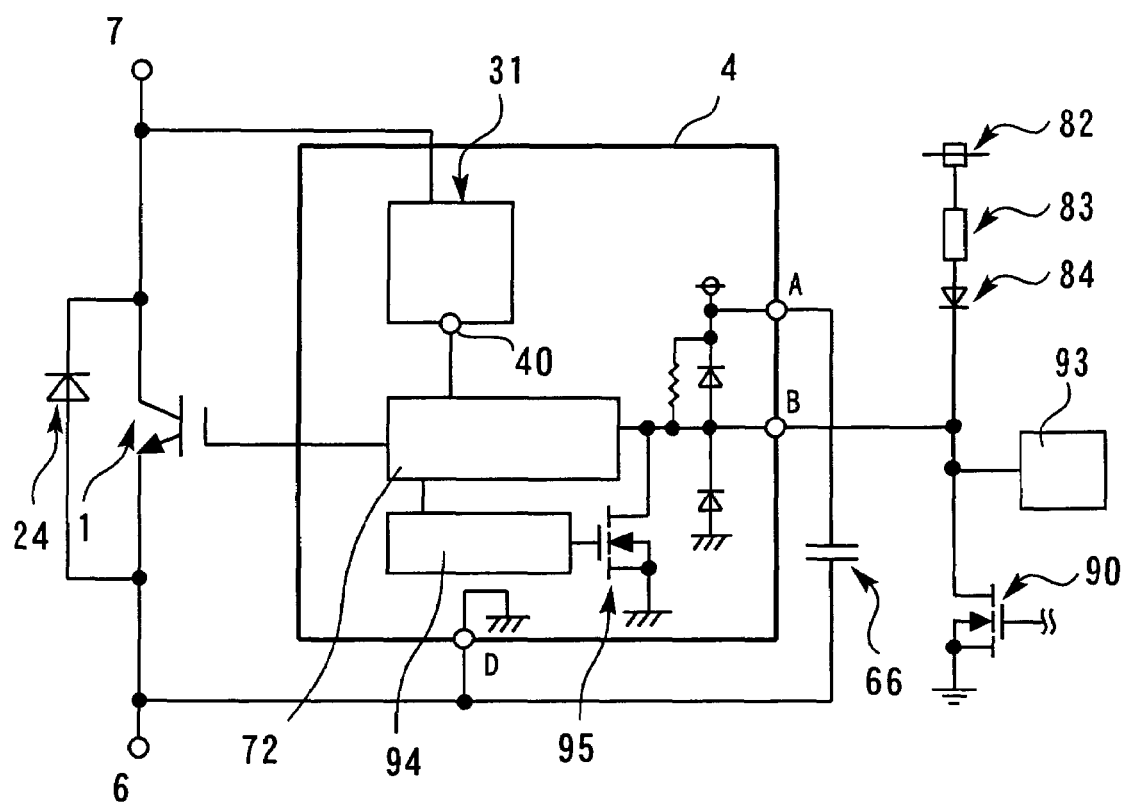
FIG. 23 is a circuit diagram showing the power semiconductor device according to Embodiment 12 of the present invention.

FIG. 23 is a circuit diagram showing the power semiconductor device according to Embodiment 12 of the present invention. A control circuit 72 has a protection circuit (not shown) which causes a switching element 1 to turn OFF. When starting a protection operation of causing the switching element 1 to turn OFF, the control circuit 72 outputs a predetermined signal to the outside. A signal anomaly detection circuit 93 is connected to a point of connection between a high voltage diode 84 and a high voltage transistor 90. This signal anomaly detection circuit 93 detects a predetermined signal outputted from the control circuit 72. This makes it possible to detect whether the control circuit 72 has started a protection operation from outside a back side high voltage integrated circuit 4.

Furthermore, the back side high voltage integrated circuit 4 is further provided with a self-oscillation circuit 94 (oscillation circuit) and a cutoff transistor 95. The self-oscillation circuit 94 outputs a signal of a predetermined oscillating frequency when the length of an input signal inputted to the control circuit 72 is less than the first time shown in Embodiment 11. The cutoff transistor 95 is provided between the input terminal of the control circuit 72 and a grounding point, turns ON in synchronization with the output voltage of the self-oscillation circuit 94 and repeatedly reduces the voltage of the input signal inputted to the control circuit 72.

When the outside control side detects that a short-time repeat pulse signal occurs on the voltage of the input terminal of the control circuit 72, it is possible to judge that an anomaly has occurred in the corresponding switching element 1 and diagnose the fault. To identify whether any one of a plurality of protection functions of the control circuit 72 has functioned and stopped operation, it is possible to provide as many oscillating frequencies of the self-oscillation circuit 94 as the protection functions and detect the oscillating frequency on the outside control side.

Embodiment 13

A power semiconductor device of this embodiment 13 will be explained. Here, explanations will be focused on differences from Embodiment 2.

Embodiment 2 provides a freewheel diode to restrain a negative voltage between the collector and emitter of the switching element 1 according to the energy stored in the inductive load. On the other hand, this embodiment 13 uses a power MOSFET instead of the freewheel diode. That is, the power MOSFET is mounted on a conductive board 3 at a distance from a switching element 1 and a back side high voltage integrated circuit 4.

Figure 24:
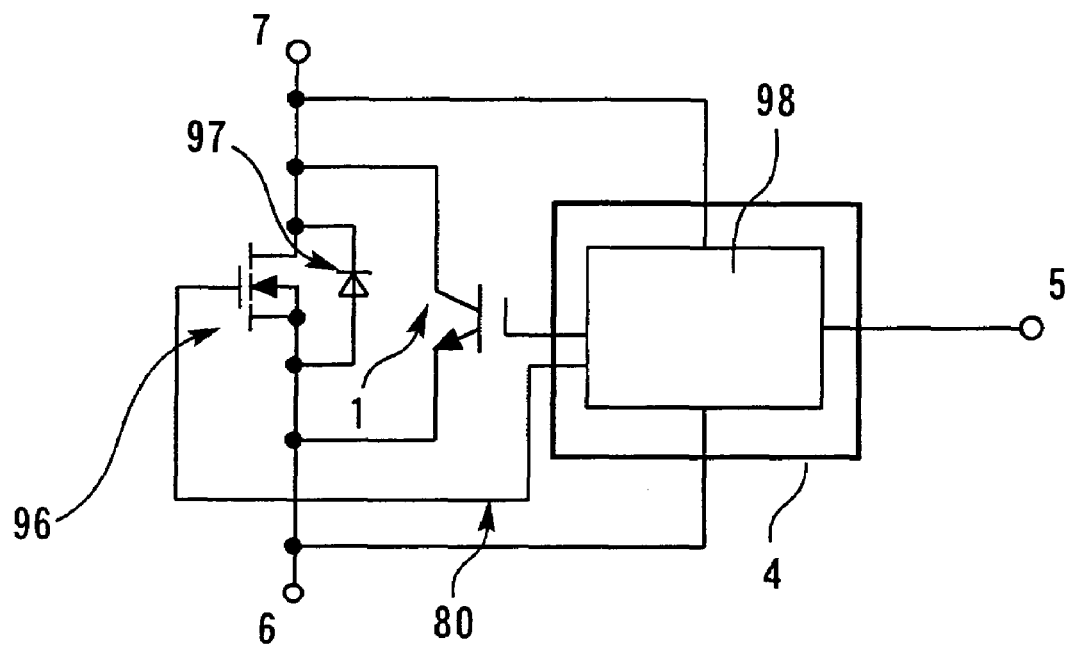
FIG. 24 is a circuit diagram showing a power semiconductor device according to Embodiment 13 of the present invention.

FIG. 24 is a circuit diagram showing a power semiconductor device according to Embodiment 13 of the present invention. A power MOSFET 96 is connected to a switching element 1 in parallel. A parasitic diode 97 occurs between the source and the drain of the power MOSFET 96. In this case, an IGBT is used as the switching element 1. The back side high voltage integrated circuit 4 has a control circuit 72 which drives the power MOSFET 96 and the switching element 1. The control circuit 72 detects the output voltage of the switching element 1 and drives the power MOSFET 96 when this output voltage is a negative potential.

In the above described configuration, a current flows through the channel part of the power MOSFET 96 in addition to the path of the current which flows through the parasitic diode 97. Therefore, the current can be passed with a voltage drop which is lower than that of a normal diode. Therefore, it is possible to reduce power loss more than Embodiment 2.

Embodiment 14

In the embodiments explained so far, the back side voltage detection element is designed to detect the back side voltage on the surface of the element at a low voltage though the back side voltage rises to a very high voltage. On the other hand, in this embodiment 14, the back side voltage detection element is basically designed to follow up to a region where the back side voltage becomes a high voltage and generate a high voltage on the surface.

Figure 25:
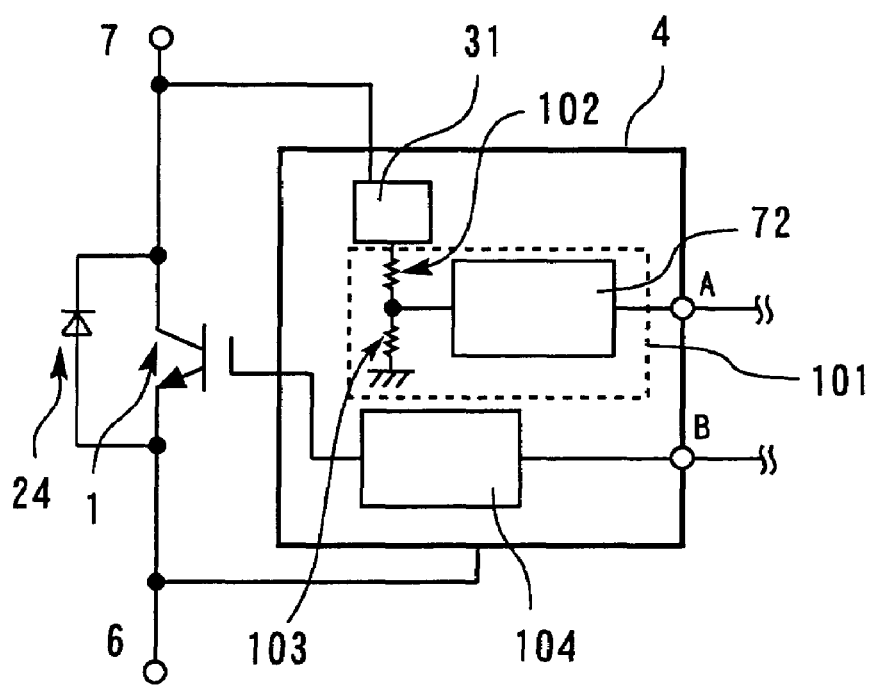
FIG. 25 is a circuit diagram showing a power semiconductor device according to Embodiment 14 of the present invention.

FIG. 25 is a circuit diagram showing a power semiconductor device according to Embodiment 14 of the present invention. A back side high voltage integrated circuit 4 has the back side voltage detection element 31 shown in Embodiment 3 and a resistive voltage divider 101. The resistive voltage divider 101 has resistors 102 and 103 connected between the back side voltage detection element 31 and a grounding point and a voltage detection element 104 connected to a point of connection between the resistor 102 and the resistor 103. The resistive voltage divider 101 divides the output voltage of the back side voltage detection element 31. The collector voltage of a switching element 1 is outputted through the back side voltage detection element 31 and the resistive voltage divider 101. Since the output of the resistive voltage divider 101 is proportional to the collector-emitter voltage of the switching element 1, it is possible to detect a busbar voltage by outputting this voltage signal to the outside.

Figure 26:
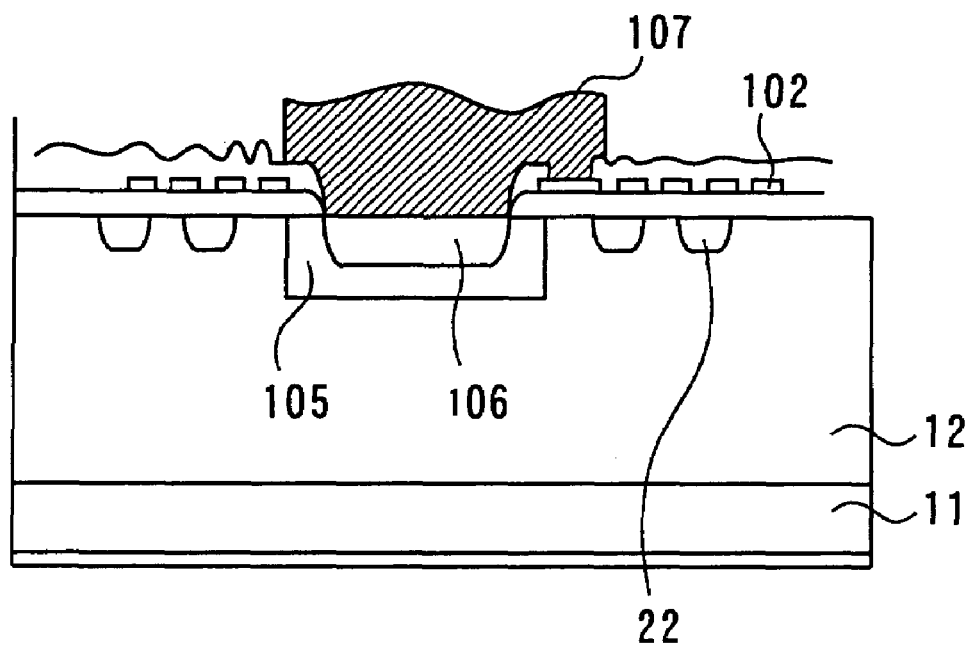
FIG. 26 is a cross-sectional view showing the resistance of the resistive voltage divider according to Embodiment 14 of the present invention.
Figure 27:
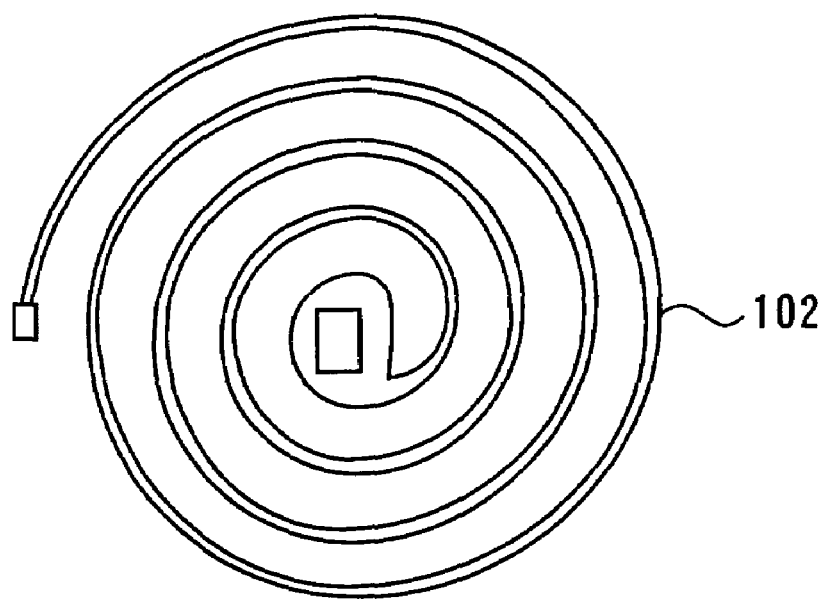
FIG. 27 is a top view showing the resistance of the resistive voltage divider according to Embodiment 14 of the present invention.
Figure 28:
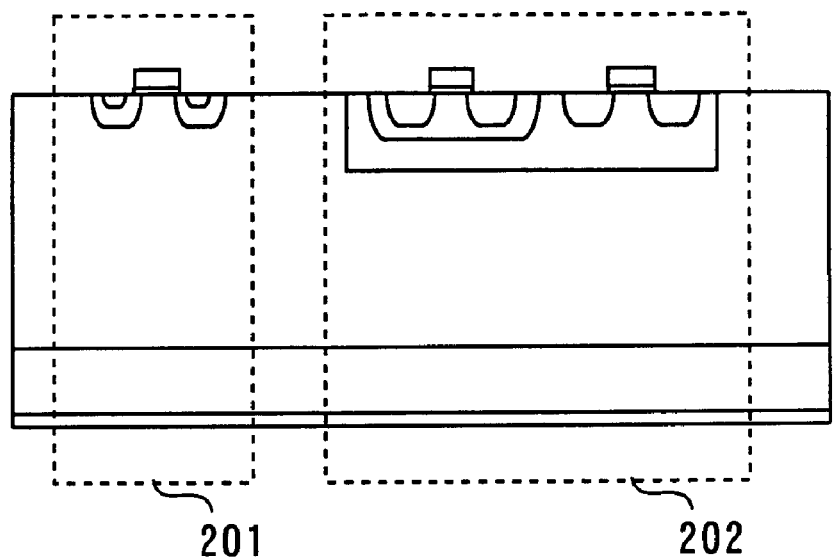
FIG. 28 is a cross-sectional view showing a conventional power semiconductor device.
Figure 29:
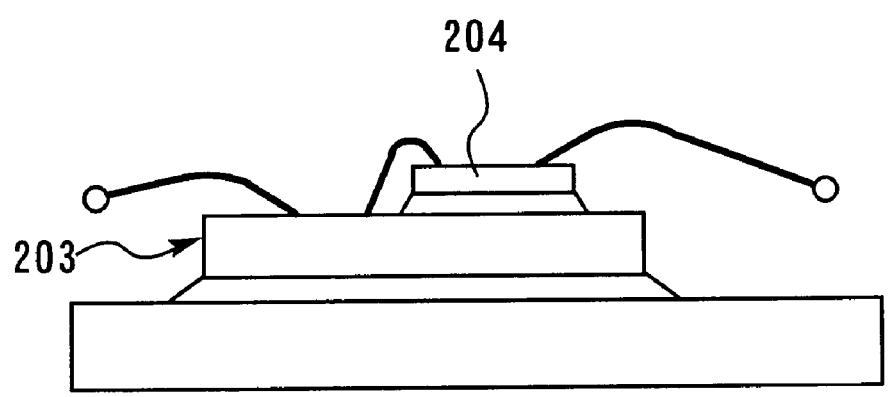
FIG. 29 is a side view showing a conventional power semiconductor device.

FIG. 26 is a cross-sectional view showing the resistance of the resistive voltage divider according to Embodiment 14 of the present invention and FIG. 27 is a top view thereof. Since a high-voltage region is generated on the surface of the element, guard rings 22 for optimizing the expansion of a depleted layer inside the substrate are provided as in the case of a normal switching element. An n-type diffusion layer 106 is provided on the surface of a p-type diffusion layer 105. An aluminum wiring 107 is provided on the substrate so as to be connected to this n-type diffusion layer 106.

Resistors 102 and 103 are formed using a material such as polysilicon (polycrystalline silicon) on the surface of a back side high voltage integrated circuit 4 when a circuit element is formed. This allows a high accuracy resistive voltage divider to be configured. The resistors 102 and 103 are formed spirally from the center (high-voltage region) to the peripheral section (low-voltage region) of a voltage detection element 104. In this way, it is possible to effectively arrange the resistors 102 and 103 and increase their resistance values.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-294074, filed on Oct. 30, 2006 and a Japanese Patent Application No. 2007-130957, filed on May 16, 2007 including specification, claims, drawings and summary, on which the Convention priority of the present application is based, are incorporated herein by reference in its entirety.

What is claimed is:

1. A power semiconductor device, comprising:
    a conductive board;
    a switching element mounted on the conductive board and electrically connected thereto; and
    an integrated circuit mounted on the conductive board at a distance from the switching element and electrically connected thereto, wherein
    the switching element turns ON/OFF a connection between first and second main electrodes in response to a control signal inputted to a control electrode, and
    the integrated circuit comprises
        a control circuit which controls ON/OFF the switching element, and
        a back side voltage detection element which detects a voltage of the back side of the integrated circuit, the control circuit turning OFF the switching element upon a period during which an output voltage of the back side voltage detection circuit is higher than a predetermined voltage exceeding a predetermined time.

2. The power semiconductor device according to claim 1, further comprising:
    a freewheel diode mounted on the conductive board at a distance from the switching element and the integrated circuit and connected in parallel to the switching element.

3. The power semiconductor device according to claim 1, wherein
    the back side voltage detection element comprises:
        a p-type semiconductor layer electrically connected to the conductive board;
        an n-type semiconductor layer provided on the p-type semiconductor layer;
        an insulated gate bipolar transistor comprising
            a first p-type diffusion layer provided on a surface of the n-type semiconductor layer,
            a first n-type diffusion layer provided on a part of the first p-type diffusion layer, and
            a gate provided on a surface of the first p-type diffusion layer interposed between the n-type semiconductor layer and the first n-type diffusion layer through a gate oxide film;
        a second p-type diffusion layer provided on the surface of the n-type semiconductor layer at a distance from the insulated gate bipolar transistor; and
        a second n-type diffusion layer provided on a surface of the second p-type diffusion layer,
    a PNP transistor comprises the p-type semiconductor layer, the n-type semiconductor layer and the second p-type diffusion layer, an NPN transistor comprises the n-type semiconductor layer, the second p-type diffusion layer and the second n-type diffusion layer, and when the insulated gate bipolar transistor turns ON, a current which flows through the insulated gate bipolar transistor becomes a base current of the PNP transistor and drives the PNP transistor, a collector current of the driven PNP transistor becomes a base current of the NPN transistor and drives the NPN transistor, and the back side voltage detection element outputs a voltage of the second n-type diffusion layer as the output voltage.

4. The power semiconductor device according to claim 3, wherein the back side voltage detection element comprises a zener diode whose cathode is connected to the second p-type diffusion layer and whose anode is grounded.

5. The power semiconductor device according to claim 3, wherein
the integrated circuit comprises:
a comparison circuit which outputs an OFF signal when the output voltage of the back side voltage detection element is higher than the predetermined voltage; and
a logic circuit which turns OFF the switching element when the OFF signal is output from the comparison circuit.

6. The power semiconductor device according to claim 3, wherein
the integrated circuit comprises:
a first comparison circuit that outputs a reduction signal when the output voltage of the back side voltage detection element is higher than a predetermined voltage; and
a voltage reduction circuit that reduces a voltage of the control electrode of the switching element when the reduction signal is output from the first comparison circuit.

7. The power semiconductor device according to claim 3, further comprising:
current sensing means for passing a micro current in proportion to an intensity of a current which flows through the switching element, wherein
the integrated circuit comprises:
conversion means for converting the micro current outputted from the current sensing means to a voltage;
a second comparison circuit which outputs an OFF signal when the voltage of the conversion means is higher than a predetermined voltage; and
a logic circuit which turns OFF the switching element when the OFF signal is outputted from the second comparison circuit.

8. The power semiconductor device according to claim 3, wherein, when performing a protection operation of turning OFF the switching element, the integrated circuit slows down a cutoff speed of the switching element compared to a cutoff speed during a normal operation.

9. The power semiconductor device according to claim 3, wherein, when the output voltage of the back side voltage detection element is higher than a predetermined voltage, the control circuit turns ON the switching element.

10. The power semiconductor device according to claim 3, wherein the integrated circuit further comprises a resistor provided between an output terminal of the back side voltage detection element and the control electrode of the switching element, and the back side voltage detection element supplies a current to the control electrode of the switching element through the resistor when the switching element switches from an OFF state to an ON state.

11. The power semiconductor device according to claim 3, further comprising:
a capacitor, one end of which is connected to the second main electrode of the switching element; and
a power supply, connected to an other end of the capacitor, that charges the capacitor, wherein the control circuit operates with an electric charge accumulated in the capacitor.

12. The power semiconductor device according to claim 11, wherein a current is supplied from the first main electrode of the switching element to the other end of the capacitor through the back side voltage detection element.

13. The power semiconductor device according to claim 1, wherein, when a length of an input signal inputted from outside is equal to or more than a predetermined time, the control circuit switches an ON operation/OFF operation of the switching element after the input signal is inputted.

14. A power semiconductor device, comprising:
a conductive board;
a switching element mounted on the conductive board and electrically connected thereto; and
an integrated circuit mounted on the conductive board at a distance from the switching element and electrically connected thereto,
the integrated circuit comprising
a control circuit which controls an ON/OFF of the switching element, and
a back side voltage detection element which detects a voltage of a back side of the integrated circuit, wherein
the switching element turns ON/OFF a connection between first and second main electrodes in response to a control signal inputted to a control electrode,
when a length of an input signal inputted from outside is equal to or more than a predetermined time, the control circuit switches an ON operation/OFF operation of the switching element after the input signal is inputted, and
the control circuit switches the switching element from an OFF operation to an ON operation when the length of the input signal is equal to or more than a first predetermined time and less than a second predetermined time and switches the switching element from an ON operation to an OFF operation when the length of the input signal is equal to or more than the second predetermined time.

15. A power semiconductor device, comprising:
a conductive board;
a switching element mounted on the conductive board and electrically connected thereto; and
an integrated circuit mounted on the conductive board at a distance from the switching element and electrically connected thereto,
the integrated circuit comprising
a control circuit which controls an ON/OFF of the switching element, and
a back side voltage detection element which detects a voltage of a back side of the integrated circuit, wherein
the switching element turns ON/OFF a connection between first and second main electrodes in response to a control signal inputted to a control electrode,
when a length of an input signal inputted from outside is equal to or more than a predetermined time, the control circuit switches an ON operation/OFF operation of the switching element after the input signal is inputted,
the control circuit switches the switching element from an OFF operation to an ON operation when the length of the input signal is equal to or more than a first predetermined time and less than a second predetermined time and switches the switching element from an ON operation to an OFF operation when the length of the input signal is equal to or more than the second predetermined time, and the integrated circuit further comprises an oscillation circuit which outputs a signal of a predetermined oscillating frequency when the length of the input signal is less than the first predetermined time; and a cutoff transistor which reduces a voltage of the input signal inputted to the control circuit in a synchronization with an output voltage of the oscillation circuit.

16. The power semiconductor device according to claim 1, further comprising:

a power MOSFET mounted on the conductive board at a distance from the switching element and the integrated circuit and connected in parallel to the switching element, wherein the control circuit detects an output voltage of the switching element and drives the power MOSFET when the output voltage is a negative potential.

17. The power semiconductor device according to claim 3, wherein the integrated circuit further comprises a resistive voltage division circuit which divides an output voltage of the back side voltage detection element, and an output voltage of the switching element is outputted through the back side voltage detection element and the resistive voltage division circuit.

* * * * *